US008276135B2

(12) United States Patent
Master

(10) Patent No.: US 8,276,135 B2
(45) Date of Patent: **\*Sep. 25, 2012**

(54) PROFILING OF SOFTWARE AND CIRCUIT DESIGNS UTILIZING DATA OPERATION ANALYSES

(75) Inventor: Paul L. Master, Sunnyvale, CA (US)

(73) Assignee: QST Holdings LLC, Palo Alto, CA (US)

( * ) Notice: Subject to any disclaimer, the term of this patent is extended or adjusted under 35 U.S.C. 154(b) by 298 days.

This patent is subject to a terminal disclaimer.

(21) Appl. No.: 10/289,640

(22) Filed: Nov. 7, 2002

(65) Prior Publication Data

US 2004/0093589 A1    May 13, 2004

(51) Int. Cl.
    *G06F 9/45* (2006.01)
(52) U.S. Cl. ...................................................... 717/161
(58) Field of Classification Search ......... 710/8; 709/217; 717/158, 130, 114, 149, 159–163; 701/1; 713/1, 324, 100, 375; 703/14, 20, 26, 4; 716/1, 18; 712/17; 714/25
    See application file for complete search history.

(56) References Cited

U.S. PATENT DOCUMENTS

| 3,409,175 A | 11/1968 | Byrne |
| 3,666,143 A | 5/1972 | Weston |
| 3,938,639 A | 2/1976 | Birrell |
| 3,949,903 A | 4/1976 | Benasutti et al. |
| 3,960,298 A | 6/1976 | Birrell |
| 3,967,062 A | 6/1976 | Dobias |
| 3,991,911 A | 11/1976 | Shannon et al. |
| 3,995,441 A | 12/1976 | McMillin |
| 4,076,145 A | 2/1978 | Zygiel |
| 4,143,793 A | 3/1979 | McMillin et al. |
| 4,172,669 A | 10/1979 | Edelbach |
| 4,174,872 A | 11/1979 | Fessler |
| 4,181,242 A | 1/1980 | Zygiel et al. |

(Continued)

FOREIGN PATENT DOCUMENTS

DE    100 18 374 A1    10/2001

(Continued)

OTHER PUBLICATIONS

Adl-Tabatabai et al., "Code Reuse in an Optimizing Compiler," OOPSLA, ACM pp. 51-68 (1996).

(Continued)

*Primary Examiner* — Tuan Anh Vu
(74) *Attorney, Agent, or Firm* — Nixon Peabody LLP

(57) ABSTRACT

The present invention is a method, system, software and data structure for profiling programs, other code, and adaptive computing integrated circuit architectures, using a plurality of data parameters such as data type, input and output data size, data source and destination locations, data pipeline length, locality of reference, distance of data movement, speed of data movement, data access frequency, number of data load/stores, memory usage, and data persistence. The profiler of the invention accepts a data set as input, and profiles a plurality of functions by measuring a plurality of data parameters for each function, during operation of the plurality of functions with the input data set, to form a plurality of measured data parameters. From the plurality of measured data parameters, the profiler generates a plurality of data parameter comparative results corresponding to the plurality of functions and the input data set. Based upon the measured data parameters, portions of the profiled code are selected for embodiment as computational elements in an adaptive computing IC architecture.

24 Claims, 5 Drawing Sheets

U.S. PATENT DOCUMENTS

| | | |
|---|---|---|
| RE30,301 E | 6/1980 | Zygiel |
| 4,218,014 A | 8/1980 | Tracy |
| 4,222,972 A | 9/1980 | Caldwell |
| 4,237,536 A | 12/1980 | Enelow et al. |
| 4,252,253 A | 2/1981 | Shannon |
| 4,302,775 A | 11/1981 | Widergren et al. |
| 4,333,587 A | 6/1982 | Fessler et al. |
| 4,354,613 A | 10/1982 | Desai et al. |
| 4,377,246 A | 3/1983 | McMillin et al. |
| 4,380,046 A | 4/1983 | Fung et al. |
| 4,393,468 A | 7/1983 | New |
| 4,413,752 A | 11/1983 | McMillin et al. |
| 4,458,584 A | 7/1984 | Annese et al. |
| 4,466,342 A | 8/1984 | Basile et al. |
| 4,475,448 A | 10/1984 | Shoaf et al. |
| 4,509,690 A | 4/1985 | Austin et al. |
| 4,520,950 A | 6/1985 | Jeans |
| 4,549,675 A | 10/1985 | Austin |
| 4,553,573 A | 11/1985 | McGarrah |
| 4,560,089 A | 12/1985 | McMillin et al. |
| 4,577,782 A | 3/1986 | Fessler |
| 4,578,799 A | 3/1986 | Scholl et al. |
| RE32,179 E | 6/1986 | Sedam et al. |
| 4,633,386 A | 12/1986 | Terepin et al. |
| 4,658,988 A | 4/1987 | Hassell |
| 4,694,416 A | 9/1987 | Wheeler et al. |
| 4,711,374 A | 12/1987 | Gaunt et al. |
| 4,713,755 A | 12/1987 | Worley, Jr. et al. |
| 4,719,056 A | 1/1988 | Scott |
| 4,726,494 A | 2/1988 | Scott |
| 4,747,516 A | 5/1988 | Baker |
| 4,748,585 A | 5/1988 | Chiarulli et al. |
| 4,758,985 A | 7/1988 | Carter |
| 4,760,525 A | 7/1988 | Webb |
| 4,760,544 A | 7/1988 | Lamb |
| 4,765,513 A | 8/1988 | McMillin et al. |
| 4,766,548 A | 8/1988 | Cedrone et al. |
| 4,781,309 A | 11/1988 | Vogel |
| 4,800,492 A | 1/1989 | Johnson et al. |
| 4,811,214 A | 3/1989 | Nosenchuck et al. |
| 4,824,075 A | 4/1989 | Holzboog |
| 4,827,426 A | 5/1989 | Patton et al. |
| 4,850,269 A | 7/1989 | Hancock et al. |
| 4,856,684 A | 8/1989 | Gerstung |
| 4,870,302 A | 9/1989 | Freeman |
| 4,901,887 A | 2/1990 | Burton |
| 4,905,231 A | 2/1990 | Leung et al. |
| 4,921,315 A | 5/1990 | Metcalfe et al. |
| 4,930,666 A | 6/1990 | Rudick |
| 4,932,564 A | 6/1990 | Austin et al. |
| 4,936,488 A | 6/1990 | Austin |
| 4,937,019 A | 6/1990 | Scott |
| 4,960,261 A | 10/1990 | Scott et al. |
| 4,961,533 A | 10/1990 | Teller et al. |
| 4,967,340 A | 10/1990 | Dawes |
| 4,974,643 A | 12/1990 | Bennett et al. |
| 4,982,876 A | 1/1991 | Scott |
| 4,993,604 A | 2/1991 | Gaunt et al. |
| 5,007,560 A | 4/1991 | Sassak |
| 5,021,947 A | 6/1991 | Campbell et al. |
| 5,040,106 A | 8/1991 | Maag |
| 5,044,171 A | 9/1991 | Farkas |
| 5,090,015 A | 2/1992 | Dabbish et al. |
| 5,099,418 A | 3/1992 | Pian et al. |
| 5,129,549 A | 7/1992 | Austin |
| 5,139,708 A | 8/1992 | Scott |
| 5,144,166 A | 9/1992 | Camarota et al. |
| 5,156,301 A | 10/1992 | Hassell et al. |
| 5,156,871 A | 10/1992 | Goulet et al. |
| 5,165,023 A | 11/1992 | Gifford |
| 5,165,575 A | 11/1992 | Scott |
| 5,190,083 A | 3/1993 | Gupta et al. |
| 5,190,189 A | 3/1993 | Zimmer et al. |
| 5,193,151 A | 3/1993 | Jain |
| 5,193,718 A | 3/1993 | Hassell et al. |
| 5,202,993 A | 4/1993 | Tarsy et al. |
| 5,203,474 A | 4/1993 | Haynes |
| 5,218,240 A | 6/1993 | Camarota et al. |
| 5,240,144 A | 8/1993 | Feldman |
| 5,245,227 A | 9/1993 | Furtek et al. |
| 5,261,099 A | 11/1993 | Bigo et al. |
| 5,263,509 A | 11/1993 | Cherry et al. |
| 5,269,442 A | 12/1993 | Vogel |
| 5,280,711 A | 1/1994 | Motta et al. |
| 5,297,400 A | 3/1994 | Benton et al. |
| 5,301,100 A | 4/1994 | Wagner |
| 5,303,846 A | 4/1994 | Shannon |
| 5,335,276 A | 8/1994 | Thompson et al. |
| 5,336,950 A | 8/1994 | Popli et al. |
| 5,339,428 A | 8/1994 | Burmeister et al. |
| 5,343,716 A | 9/1994 | Swanson et al. |
| 5,361,362 A | 11/1994 | Benkeser et al. |
| 5,367,651 A | 11/1994 | Smith et al. |
| 5,367,687 A | 11/1994 | Tarsy et al. |
| 5,368,198 A | 11/1994 | Goulet |
| 5,379,343 A | 1/1995 | Grube et al. |
| 5,381,546 A | 1/1995 | Servi et al. |
| 5,381,550 A | 1/1995 | Jourdenais et al. |
| 5,388,062 A | 2/1995 | Knutson |
| 5,388,212 A | 2/1995 | Grube et al. |
| 5,392,960 A | 2/1995 | Kendt et al. |
| 5,437,395 A | 8/1995 | Bull et al. |
| 5,450,557 A | 9/1995 | Kopp et al. |
| 5,454,406 A | 10/1995 | Rejret et al. |
| 5,465,368 A | 11/1995 | Davidson et al. |
| 5,475,856 A | 12/1995 | Kogge |
| 5,479,055 A | 12/1995 | Eccles |
| 5,490,165 A | 2/1996 | Blakeney, II et al. |
| 5,491,823 A | 2/1996 | Ruttenberg |
| 5,504,891 A | 4/1996 | Motoyama et al. |
| 5,507,009 A | 4/1996 | Grube et al. |
| 5,515,519 A | 5/1996 | Yoshioka et al. |
| 5,517,600 A | 5/1996 | Shimokawa |
| 5,519,694 A | 5/1996 | Brewer et al. |
| 5,522,070 A | 5/1996 | Sumimoto |
| 5,530,964 A | 6/1996 | Alpert et al. |
| 5,534,796 A | 7/1996 | Edwards |
| 5,542,265 A | 8/1996 | Rutland |
| 5,553,755 A | 9/1996 | Bonewald et al. |
| 5,555,417 A | 9/1996 | Odnert et al. |
| 5,560,028 A | 9/1996 | Sachs et al. |
| 5,560,038 A | 9/1996 | Haddock |
| 5,570,587 A | 11/1996 | Kim |
| 5,572,572 A | 11/1996 | Kawan et al. |
| 5,590,353 A | 12/1996 | Sakakibara et al. |
| 5,594,657 A | 1/1997 | Cantone et al. |
| 5,600,810 A | 2/1997 | Ohkami |
| 5,600,844 A | 2/1997 | Shaw et al. |
| 5,602,833 A | 2/1997 | Zehavi |
| 5,603,043 A | 2/1997 | Taylor et al. |
| 5,607,083 A | 3/1997 | Vogel et al. |
| 5,608,643 A | 3/1997 | Wichter et al. |
| 5,611,867 A | 3/1997 | Cooper et al. |
| 5,623,545 A | 4/1997 | Childs et al. |
| 5,625,669 A | 4/1997 | McGregor et al. |
| 5,626,407 A | 5/1997 | Westcott |
| 5,630,206 A | 5/1997 | Urban et al. |
| 5,635,940 A | 6/1997 | Hickman et al. |
| 5,646,544 A | 7/1997 | Iadanza |
| 5,646,545 A | 7/1997 | Trimberger et al. |
| 5,647,512 A | 7/1997 | Assis Mascarenhas deOliveira et al. |
| 5,667,110 A | 9/1997 | McCann et al. |
| 5,684,793 A | 11/1997 | Kiema et al. |
| 5,684,980 A | 11/1997 | Casselman |
| 5,687,236 A | 11/1997 | Moskowitz et al. |
| 5,694,613 A | 12/1997 | Suzuki |
| 5,694,794 A | 12/1997 | Jerg et al. |
| 5,699,328 A | 12/1997 | Ishizaki et al. |
| 5,701,398 A | 12/1997 | Glier et al. |
| 5,701,482 A | 12/1997 | Harrison et al. |
| 5,704,053 A | 12/1997 | Santhanam |
| 5,706,191 A | 1/1998 | Bassett et al. |
| 5,706,976 A | 1/1998 | Purkey |
| 5,712,996 A | 1/1998 | Schepers |
| 5,720,002 A | 2/1998 | Wang |
| 5,721,693 A | 2/1998 | Song |

| | | | | | | |
|---|---|---|---|---|---|---|
| 5,721,854 A | 2/1998 | Ebicioglu et al. | | 5,999,734 A | 12/1999 | Willis et al. |
| 5,729,754 A | 3/1998 | Estes | | 6,005,943 A | 12/1999 | Cohen et al. |
| 5,732,563 A | 3/1998 | Bethuy et al. | | 6,006,249 A | 12/1999 | Leong |
| 5,734,808 A | 3/1998 | Takeda | | 6,016,395 A | 1/2000 | Mohamed |
| 5,737,631 A | 4/1998 | Trimberger | | 6,021,186 A | 2/2000 | Suzuki et al. |
| 5,742,180 A | 4/1998 | DeHon et al. | | 6,021,492 A | 2/2000 | May |
| 5,742,821 A | 4/1998 | Prasanna | | 6,023,742 A | 2/2000 | Ebeling et al. |
| 5,745,366 A | 4/1998 | Highma et al. | | 6,023,755 A | 2/2000 | Casselman |
| RE35,780 E | 5/1998 | Hassell et al. | | 6,028,610 A | 2/2000 | Deering |
| 5,751,295 A | 5/1998 | Becklund et al. | | 6,036,166 A | 3/2000 | Olson |
| 5,754,227 A | 5/1998 | Fukuoka | | 6,039,219 A | 3/2000 | Bach et al. |
| 5,758,261 A | 5/1998 | Weideman | | 6,041,322 A | 3/2000 | Meng et al. |
| 5,768,561 A | 6/1998 | Wise | | 6,041,970 A | 3/2000 | Vogel |
| 5,778,439 A | 7/1998 | Trimberger et al. | | 6,046,603 A | 4/2000 | New |
| 5,784,636 A | 7/1998 | Rupp | | 6,047,115 A | 4/2000 | Mohan et al. |
| 5,787,237 A | 7/1998 | Reilly | | 6,052,600 A | 4/2000 | Fette et al. |
| 5,790,817 A | 8/1998 | Asghar et al. | | 6,055,314 A | 4/2000 | Spies et al. |
| 5,791,517 A | 8/1998 | Avital | | 6,056,194 A | 5/2000 | Kolls |
| 5,791,523 A | 8/1998 | Oh | | 6,059,840 A | 5/2000 | Click, Jr. |
| 5,794,062 A | 8/1998 | Baxter | | 6,061,580 A | 5/2000 | Altschul et al. |
| 5,794,067 A | 8/1998 | Kadowaki | | 6,073,132 A | 6/2000 | Gehman |
| 5,802,055 A | 9/1998 | Krein et al. | | 6,076,174 A | 6/2000 | Freund |
| 5,812,851 A | 9/1998 | Levy et al. | | 6,078,736 A | 6/2000 | Guccione |
| 5,818,603 A | 10/1998 | Motoyama | | 6,085,740 A | 7/2000 | Ivri et al. |
| 5,819,255 A | 10/1998 | Celis et al. | | 6,088,043 A | 7/2000 | Kelleher et al. |
| 5,822,308 A | 10/1998 | Weigand et al. | | 6,091,263 A | 7/2000 | New et al. |
| 5,822,313 A | 10/1998 | Malek et al. | | 6,091,765 A | 7/2000 | Pietzold, III et al. |
| 5,822,360 A | 10/1998 | Lee et al. | | 6,094,065 A | 7/2000 | Tavana et al. |
| 5,828,858 A | 10/1998 | Athanas et al. | | 6,094,726 A | 7/2000 | Gonion et al. |
| 5,829,085 A | 11/1998 | Jerg et al. | | 6,111,893 A | 8/2000 | Volftsun et al. |
| 5,835,753 A | 11/1998 | Witt | | 6,111,935 A | 8/2000 | Hughes-Hartogs |
| 5,838,165 A | 11/1998 | Chatter | | 6,115,751 A | 9/2000 | Tam et al. |
| 5,845,815 A | 12/1998 | Vogel | | 6,119,178 A | 9/2000 | Martin et al. |
| 5,854,929 A | 12/1998 | Van Pract et al. | | 6,120,551 A | 9/2000 | Law et al. |
| 5,860,021 A | 1/1999 | Klingman | | 6,122,670 A | 9/2000 | Bennett et al. |
| 5,862,961 A | 1/1999 | Motta et al. | | 6,128,307 A | 10/2000 | Brown |
| 5,870,427 A | 2/1999 | Teidemann, Jr. et al. | | 6,134,605 A | 10/2000 | Hudson et al. |
| 5,873,045 A | 2/1999 | Lee et al. | | 6,138,693 A | 10/2000 | Matz |
| 5,881,106 A | 3/1999 | Cartier | | 6,141,283 A | 10/2000 | Bogin et al. |
| 5,884,284 A | 3/1999 | Peters et al. | | 6,150,838 A | 11/2000 | Wittig et al. |
| 5,886,537 A | 3/1999 | Macias et al. | | 6,154,494 A | 11/2000 | Sugahara et al. |
| 5,887,174 A | 3/1999 | Simons et al. | | 6,157,997 A | 12/2000 | Oowaki et al. |
| 5,889,816 A | 3/1999 | Agrawal et al. | | 6,158,031 A | 12/2000 | Mack et al. |
| 5,889,989 A | 3/1999 | Robertazzi et al. | | 6,173,389 B1 | 1/2001 | Pechanek et al. |
| 5,890,014 A * | 3/1999 | Long .................. 710/8 | | 6,175,854 B1 | 1/2001 | Bretscher |
| 5,892,900 A | 4/1999 | Ginter et al. | | 6,175,892 B1 | 1/2001 | Sazzad et al. |
| 5,892,950 A | 4/1999 | Rigori et al. | | 6,181,981 B1 | 1/2001 | Varga et al. |
| 5,892,961 A | 4/1999 | Trimberger | | 6,185,418 B1 | 2/2001 | MacLellan et al. |
| 5,892,962 A | 4/1999 | Cloutier | | 6,192,070 B1 | 2/2001 | Poon et al. |
| 5,894,473 A | 4/1999 | Dent | | 6,192,255 B1 | 2/2001 | Lewis et al. |
| 5,901,884 A | 5/1999 | Goulet et al. | | 6,192,388 B1 | 2/2001 | Cajolet |
| 5,903,886 A | 5/1999 | Heimlich et al. | | 6,195,788 B1 | 2/2001 | Leaver et al. |
| 5,907,285 A | 5/1999 | Toms et al. | | 6,198,924 B1 | 3/2001 | Ishii et al. |
| 5,907,580 A | 5/1999 | Cummings | | 6,199,181 B1 | 3/2001 | Rechef et al. |
| 5,910,733 A | 6/1999 | Bertolet et al. | | 6,202,130 B1 | 3/2001 | Scales, III et al. |
| 5,912,572 A | 6/1999 | Graf, III | | 6,202,189 B1 | 3/2001 | Hinedi et al. |
| 5,913,172 A | 6/1999 | McCabe et al. | | 6,219,697 B1 | 4/2001 | Lawande et al. |
| 5,917,852 A | 6/1999 | Butterfield et al. | | 6,219,756 B1 | 4/2001 | Kasamizugami |
| 5,920,801 A | 7/1999 | Thomas et al. | | 6,219,780 B1 | 4/2001 | Lipasti |
| 5,931,918 A | 8/1999 | Row et al. | | 6,223,222 B1 | 4/2001 | Fijolek et al. |
| 5,933,642 A | 8/1999 | Greenbaum et al. | | 6,226,387 B1 | 5/2001 | Tewfik et al. |
| 5,940,438 A | 8/1999 | Poon et al. | | 6,230,307 B1 | 5/2001 | Davis et al. |
| 5,949,415 A | 9/1999 | Lin et al. | | 6,237,029 B1 | 5/2001 | Master et al. |
| 5,950,011 A | 9/1999 | Albrecht et al. | | 6,246,883 B1 | 6/2001 | Lee |
| 5,950,131 A | 9/1999 | Vilmur | | 6,247,125 B1 | 6/2001 | Noel-Baron et al. |
| 5,951,674 A | 9/1999 | Moreno | | 6,249,251 B1 | 6/2001 | Chang et al. |
| 5,953,322 A | 9/1999 | Kimball | | 6,258,725 B1 | 7/2001 | Lee et al. |
| 5,956,518 A | 9/1999 | DeHon et al. | | 6,263,057 B1 | 7/2001 | Silverman |
| 5,956,967 A | 9/1999 | Kim | | 6,266,760 B1 | 7/2001 | DeHon et al. |
| 5,959,811 A | 9/1999 | Richardson | | 6,272,579 B1 | 8/2001 | Lentz et al. |
| 5,959,881 A | 9/1999 | Trimberger et al. | | 6,272,616 B1 | 8/2001 | Fernando et al. |
| 5,963,048 A | 10/1999 | Harrison et al. | | 6,281,703 B1 | 8/2001 | Furuta et al. |
| 5,966,534 A | 10/1999 | Cooke et al. | | 6,282,627 B1 | 8/2001 | Wong et al. |
| 5,970,254 A | 10/1999 | Cooke et al. | | 6,286,134 B1 | 9/2001 | Click, Jr. et al. |
| 5,987,105 A | 11/1999 | Jenkins et al. | | 6,289,375 B1 * | 9/2001 | Knight et al. .................. 709/217 |
| 5,987,611 A | 11/1999 | Freund | | 6,289,434 B1 | 9/2001 | Roy |
| 5,991,302 A | 11/1999 | Berl et al. | | 6,289,488 B1 | 9/2001 | Dave et al. |
| 5,991,308 A | 11/1999 | Fuhrmann et al. | | 6,292,822 B1 | 9/2001 | Hardwick |
| 5,993,739 A | 11/1999 | Lyon | | 6,292,827 B1 * | 9/2001 | Raz .................. 709/217 |

| Patent/Pub No. | Date | Inventor(s) |
|---|---|---|
| 6,292,830 B1 | 9/2001 | Taylor et al. |
| 6,292,938 B1 | 9/2001 | Sarkar et al. |
| 6,301,653 B1 | 10/2001 | Mohamed et al. |
| 6,305,014 B1 | 10/2001 | Roediger et al. |
| 6,311,149 B1 | 10/2001 | Ryan et al. |
| 6,321,985 B1 | 11/2001 | Kolls |
| 6,326,806 B1 | 12/2001 | Fallside et al. |
| 6,346,824 B1 | 2/2002 | New |
| 6,347,346 B1 | 2/2002 | Taylor |
| 6,349,394 B1 | 2/2002 | Brock et al. |
| 6,353,841 B1 | 3/2002 | Marshall et al. |
| 6,356,994 B1 | 3/2002 | Barry et al. |
| 6,359,248 B1 | 3/2002 | Mardi |
| 6,360,256 B1 | 3/2002 | Lim |
| 6,360,259 B1 | 3/2002 | Bradley |
| 6,360,263 B1 | 3/2002 | Kurtzberg et al. |
| 6,363,411 B1 | 3/2002 | Dugan et al. |
| 6,366,999 B1 | 4/2002 | Drabenstott et al. |
| 6,377,983 B1 | 4/2002 | Cohen et al. |
| 6,378,072 B1 | 4/2002 | Collins et al. |
| 6,381,293 B1 | 4/2002 | Lee et al. |
| 6,381,735 B1 * | 4/2002 | Hunt .................. 717/158 |
| 6,385,751 B1 | 5/2002 | Wolf |
| 6,405,214 B1 | 6/2002 | Meade, II |
| 6,408,039 B1 | 6/2002 | Ito |
| 6,410,941 B1 | 6/2002 | Taylor et al. |
| 6,411,612 B1 | 6/2002 | Halford et al. |
| 6,421,372 B1 | 7/2002 | Bierly et al. |
| 6,421,809 B1 | 7/2002 | Wuytack et al. |
| 6,426,649 B1 | 7/2002 | Fu et al. |
| 6,430,624 B1 | 8/2002 | Jamtgaard et al. |
| 6,433,578 B1 | 8/2002 | Wasson |
| 6,434,590 B1 | 8/2002 | Blelloch et al. |
| 6,438,737 B1 | 8/2002 | Morelli et al. |
| 6,446,258 B1 | 9/2002 | McKinsey et al. |
| 6,449,747 B2 | 9/2002 | Wuytack et al. |
| 6,456,996 B1 | 9/2002 | Crawford, Jr. et al. |
| 6,459,883 B2 | 10/2002 | Subramanian et al. |
| 6,467,009 B1 | 10/2002 | Winegarden et al. |
| 6,469,540 B2 | 10/2002 | Nakaya |
| 6,473,609 B1 | 10/2002 | Schwartz et al. |
| 6,483,343 B1 | 11/2002 | Faith et al. |
| 6,484,304 B1 * | 11/2002 | Ussery et al. .................. 716/18 |
| 6,507,947 B1 | 1/2003 | Schreiber et al. |
| 6,510,138 B1 | 1/2003 | Pannell |
| 6,510,510 B1 | 1/2003 | Garde |
| 6,526,570 B1 | 2/2003 | Click, Jr. et al. |
| 6,538,470 B1 | 3/2003 | Langhammer et al. |
| 6,556,044 B2 | 4/2003 | Langhammer et al. |
| 6,563,891 B1 | 5/2003 | Eriksson et al. |
| 6,570,877 B1 | 5/2003 | Kloth et al. |
| 6,577,678 B2 | 6/2003 | Scheuermann |
| 6,587,684 B1 | 7/2003 | Hsu et al. |
| 6,590,415 B2 | 7/2003 | Agrawal et al. |
| 6,601,086 B1 | 7/2003 | Howard et al. |
| 6,601,158 B1 | 7/2003 | Abbott et al. |
| 6,604,085 B1 | 8/2003 | Kolls |
| 6,604,189 B1 | 8/2003 | Zemlyak et al. |
| 6,606,529 B1 | 8/2003 | Crowder, Jr. et al. |
| 6,615,333 B1 | 9/2003 | Hoogerbrugge et al. |
| 6,618,434 B2 | 9/2003 | Heidari-Bateni et al. |
| 6,640,304 B2 | 10/2003 | Ginter et al. |
| 6,647,429 B1 | 11/2003 | Semal |
| 6,653,859 B2 | 11/2003 | Sihlbom et al. |
| 6,658,564 B1 * | 12/2003 | Smith et al. .................. 713/100 |
| 6,675,265 B2 | 1/2004 | Barroso et al. |
| 6,675,284 B1 | 1/2004 | Warren |
| 6,691,148 B1 | 2/2004 | Zinky et al. |
| 6,694,380 B1 | 2/2004 | Wolrich et al. |
| 6,711,617 B1 | 3/2004 | Bantz et al. |
| 6,718,182 B1 | 4/2004 | Kung |
| 6,718,541 B2 | 4/2004 | Ostanevich et al. |
| 6,721,286 B1 | 4/2004 | Williams et al. |
| 6,721,884 B1 | 4/2004 | De Oliveira Kastrup Pereira et al. |
| 6,732,354 B2 | 5/2004 | Ebeling et al. |
| 6,735,621 B1 | 5/2004 | Yoakum et al. |
| 6,738,744 B2 | 5/2004 | Kirovski et al. |
| 6,748,360 B2 | 6/2004 | Pitman et al. |
| 6,751,723 B1 | 6/2004 | Kundu et al. |
| 6,754,470 B2 | 6/2004 | Hendrickson et al. |
| 6,760,587 B2 | 7/2004 | Holtzman et al. |
| 6,760,833 B1 | 7/2004 | Dowling |
| 6,766,165 B2 | 7/2004 | Sharma et al. |
| 6,778,212 B1 | 8/2004 | Deng et al. |
| 6,785,341 B2 | 8/2004 | Walton et al. |
| 6,795,930 B1 * | 9/2004 | Laurenti et al. .................. 713/324 |
| 6,819,140 B2 | 11/2004 | Yamanaka et al. |
| 6,823,448 B2 | 11/2004 | Roth et al. |
| 6,826,748 B1 * | 11/2004 | Hohensee et al. .............. 717/130 |
| 6,829,633 B2 | 12/2004 | Gelfer et al. |
| 6,832,250 B1 | 12/2004 | Coons et al. |
| 6,836,839 B2 | 12/2004 | Master et al. |
| 6,859,434 B2 | 2/2005 | Segal et al. |
| 6,865,664 B2 | 3/2005 | Budrovic et al. |
| 6,871,236 B2 | 3/2005 | Fishman et al. |
| 6,883,084 B1 | 4/2005 | Donohoe |
| 6,894,996 B2 | 5/2005 | Lee |
| 6,901,440 B1 | 5/2005 | Bimm et al. |
| 6,912,515 B2 | 6/2005 | Jackson et al. |
| 6,941,336 B1 | 9/2005 | Mar |
| 6,980,515 B1 | 12/2005 | Schunk et al. |
| 6,985,517 B2 | 1/2006 | Matsumoto et al. |
| 6,986,021 B2 | 1/2006 | Master et al. |
| 6,986,142 B1 | 1/2006 | Ehlig et al. |
| 6,988,139 B1 | 1/2006 | Jervis et al. |
| 7,032,229 B1 | 4/2006 | Flores et al. |
| 7,044,741 B2 | 5/2006 | Leem |
| 7,082,456 B2 | 7/2006 | Mani-Meitav et al. |
| 7,139,910 B1 | 11/2006 | Ainsworth et al. |
| 7,142,731 B1 | 11/2006 | Toi |
| 7,171,548 B2 * | 1/2007 | Smith et al. .................. 713/1 |
| 7,249,242 B2 | 7/2007 | Ramchandran |
| 7,996,827 B2 * | 8/2011 | Vorbach et al. .................. 717/149 |
| 2001/0003191 A1 | 6/2001 | Kovacs et al. |
| 2001/0023482 A1 | 9/2001 | Wray |
| 2001/0029515 A1 | 10/2001 | Mirsky |
| 2001/0034795 A1 | 10/2001 | Moulton et al. |
| 2001/0039654 A1 | 11/2001 | Miyamoto |
| 2001/0048713 A1 | 12/2001 | Medlock et al. |
| 2001/0048714 A1 | 12/2001 | Jha |
| 2001/0050948 A1 | 12/2001 | Ramberg et al. |
| 2002/0010848 A1 | 1/2002 | Kamano et al. |
| 2002/0013799 A1 | 1/2002 | Blaker |
| 2002/0013937 A1 | 1/2002 | Ostanevich et al. |
| 2002/0015435 A1 | 2/2002 | Rieken |
| 2002/0015439 A1 | 2/2002 | Kohli et al. |
| 2002/0023210 A1 | 2/2002 | Tuomenoksa et al. |
| 2002/0024942 A1 | 2/2002 | Tsuneki et al. |
| 2002/0024993 A1 | 2/2002 | Subramanian et al. |
| 2002/0031166 A1 | 3/2002 | Subramanian et al. |
| 2002/0032551 A1 | 3/2002 | Zakiya |
| 2002/0035623 A1 | 3/2002 | Lawande et al. |
| 2002/0041581 A1 | 4/2002 | Aramaki |
| 2002/0042875 A1 | 4/2002 | Shukla |
| 2002/0042907 A1 | 4/2002 | Yamanaka et al. |
| 2002/0061741 A1 | 5/2002 | Leung et al. |
| 2002/0069282 A1 | 6/2002 | Reisman |
| 2002/0072830 A1 * | 6/2002 | Hunt .................. 701/1 |
| 2002/0078337 A1 | 6/2002 | Moreau et al. |
| 2002/0083305 A1 | 6/2002 | Renard et al. |
| 2002/0083423 A1 | 6/2002 | Ostanevich et al. |
| 2002/0087829 A1 | 7/2002 | Snyder et al. |
| 2002/0089348 A1 | 7/2002 | Langhammer |
| 2002/0101909 A1 | 8/2002 | Chen et al. |
| 2002/0107905 A1 | 8/2002 | Roe et al. |
| 2002/0107962 A1 | 8/2002 | Richter et al. |
| 2002/0119803 A1 | 8/2002 | Bitterlich et al. |
| 2002/0120672 A1 | 8/2002 | Butt et al. |
| 2002/0133688 A1 | 9/2002 | Lee et al. |
| 2002/0138716 A1 | 9/2002 | Master et al. |
| 2002/0141489 A1 | 10/2002 | Imaizumi |
| 2002/0147845 A1 | 10/2002 | Sanchez-Herrero et al. |
| 2002/0159503 A1 | 10/2002 | Ramachandran |
| 2002/0162026 A1 | 10/2002 | Neuman et al. |
| 2002/0168018 A1 | 11/2002 | Scheuermann |
| 2002/0181559 A1 | 12/2002 | Heidari-Bateni et al. |
| 2002/0184275 A1 | 12/2002 | Dutta et al. |
| 2002/0184291 A1 | 12/2002 | Hogenauer |

| | | | |
|---|---|---|---|
| 2002/0184498 | A1 | 12/2002 | Qi |
| 2002/0191790 | A1 | 12/2002 | Anand et al. |
| 2003/0007606 | A1 | 1/2003 | Suder et al. |
| 2003/0012270 | A1 | 1/2003 | Zhou et al. |
| 2003/0018446 | A1 | 1/2003 | Makowski et al. |
| 2003/0018700 | A1 | 1/2003 | Giroti et al. |
| 2003/0023830 | A1 | 1/2003 | Hogenauer |
| 2003/0026242 | A1 | 2/2003 | Jokinen et al. |
| 2003/0030004 | A1 | 2/2003 | Dixon et al. |
| 2003/0046421 | A1 | 3/2003 | Horvitz et al. |
| 2003/0061260 | A1 | 3/2003 | Rajkumar |
| 2003/0061311 | A1 | 3/2003 | Lo |
| 2003/0063656 | A1 | 4/2003 | Rao et al. |
| 2003/0074473 | A1 | 4/2003 | Pham et al. |
| 2003/0076815 | A1 | 4/2003 | Miller et al. |
| 2003/0099223 | A1 | 5/2003 | Chang et al. |
| 2003/0102889 | A1 | 6/2003 | Master et al. |
| 2003/0105949 | A1 | 6/2003 | Master et al. |
| 2003/0110485 | A1 | 6/2003 | Lu et al. |
| 2003/0142818 | A1 | 7/2003 | Raghunathan et al. |
| 2003/0154357 | A1 | 8/2003 | Master et al. |
| 2003/0163723 | A1 | 8/2003 | Kozuch et al. |
| 2003/0171907 | A1* | 9/2003 | Gal-On et al. ............... 703/14 |
| 2003/0172138 | A1 | 9/2003 | McCormack et al. |
| 2003/0172139 | A1 | 9/2003 | Srinivasan et al. |
| 2003/0200538 | A1 | 10/2003 | Ebeling et al. |
| 2003/0212684 | A1 | 11/2003 | Meyer et al. |
| 2003/0229864 | A1 | 12/2003 | Watkins |
| 2004/0006584 | A1 | 1/2004 | Vandeweerd |
| 2004/0010645 | A1 | 1/2004 | Scheuermann et al. |
| 2004/0015970 | A1 | 1/2004 | Scheuermann |
| 2004/0025159 | A1 | 2/2004 | Scheuermann et al. |
| 2004/0057505 | A1 | 3/2004 | Valio |
| 2004/0062300 | A1 | 4/2004 | McDonough et al. |
| 2004/0081248 | A1 | 4/2004 | Parolari |
| 2004/0093479 | A1 | 5/2004 | Ramchandran |
| 2004/0168044 | A1 | 8/2004 | Ramchandran |
| 2005/0044344 | A1 | 2/2005 | Stevens |
| 2005/0160402 | A1* | 7/2005 | Wang et al. ............... 717/114 |
| 2005/0166038 | A1 | 7/2005 | Wang et al. |
| 2005/0198199 | A1 | 9/2005 | Dowling |
| 2006/0031660 | A1 | 2/2006 | Master et al. |

FOREIGN PATENT DOCUMENTS

| | | |
|---|---|---|
| EP | 0 301 169 A1 | 2/1989 |
| EP | 0 166 586 B1 | 1/1991 |
| EP | 0 236 633 B1 | 5/1991 |
| EP | 0 478 624 B1 | 4/1992 |
| EP | 0 479 102 A2 | 4/1992 |
| EP | 0 661 831 A2 | 7/1995 |
| EP | 0 668 659 A2 | 8/1995 |
| EP | 0 690 588 A2 | 1/1996 |
| EP | 0 691 754 A2 | 1/1996 |
| EP | 0 768 602 A2 | 4/1997 |
| EP | 0 817 003 A2 | 1/1998 |
| EP | 0 821 495 A2 | 1/1998 |
| EP | 0 866 210 A2 | 9/1998 |
| EP | 0 923 247 A2 | 6/1999 |
| EP | 0 926 596 A2 | 6/1999 |
| EP | 1 056 217 A2 | 11/2000 |
| EP | 1 061 437 A1 | 12/2000 |
| EP | 1 061 443 A2 | 12/2000 |
| EP | 1 126 368 A2 | 8/2001 |
| EP | 1 150 506 A2 | 10/2001 |
| EP | 1 189 358 A1 | 3/2002 |
| GB | 2 067 800 A | 7/1981 |
| GB | 2 237 908 A | 5/1991 |
| JP | 62-249456 | 10/1987 |
| JP | 63-147258 | 6/1988 |
| JP | 4-51546 | 2/1992 |
| JP | 7-064789 | 3/1995 |
| JP | 7066718 | 3/1995 |
| JP | 10233676 | 9/1998 |
| JP | 10254696 | 9/1998 |
| JP | 11296345 | 10/1999 |
| JP | 2000315731 | 11/2000 |
| JP | 2001-053703 | 2/2001 |
| WO | WO 89/05029 A1 | 6/1989 |
| WO | WO 89/11443 A2 | 11/1989 |
| WO | WO 91/00238 A1 | 1/1991 |
| WO | WO 93/13603 A1 | 7/1993 |
| WO | WO 95/11855 A1 | 5/1995 |
| WO | WO 96/33558 A1 | 10/1996 |
| WO | WO 98/32071 A3 | 7/1998 |
| WO | WO 99/03776 A1 | 1/1999 |
| WO | WO 99/21094 A2 | 4/1999 |
| WO | WO 99/26860 A1 | 6/1999 |
| WO | WO 99/65818 A1 | 12/1999 |
| WO | WO 00/19311 A1 | 4/2000 |
| WO | WO 00/65855 A1 | 11/2000 |
| WO | WO 00/69073 A1 | 11/2000 |
| WO | WO 01/11281 A1 | 2/2001 |
| WO | WO 01/22235 A1 | 3/2001 |
| WO | WO 01/76129 A2 | 10/2001 |
| WO | WO 02/12978 A2 | 2/2002 |

OTHER PUBLICATIONS

Altera Apex 20K 1999.

Andraka Consulting Group, "Distributed Arithmetic," Obtained from: http://www.fpga-guru.com/distribu.htm (1998-2000).

Bickerstaff et al., "A Unified Turbo/Viterbi Channel Decoder for 3GPP Mobile Wireless in 0.18μ CMOS," IEEE *Journal of Solid-State Circuits* 37(11):1555-62 (2002).

Bogdan et al., "Power Reduction Techniques for a Viterbi Decoder Implementation,".

Chang et al., "Low-Power Bit-Serial Viterbi Decoder for Next Generation Wide-Band CDMA Systems,".

Clark et al., "Error Correction Coding for Digital Communications," Plenum Press NY (1981).

Garrett et al, "Low Power Architecture of the Soft-Output Viterbi Algorithm,".

Hanna et al., "A Normalized Backpropagation Learning Algorithm for Multilayer Feed-Forward Neural Adaptive Filters," *Neural Networks for Signal Processing XI*, Proceedings of the 2001 IEEE Signal Processing Society Workshop pp. 63-72 (Sep. 2001).

Hekstra, "An Alternative to Metric Rescaling in Viterbi Decoders," IEEE Transactions on Communications vol. 37 No. 11 (Nov. 1989).

Hendrix, "Viterbi Decoding Techniques in the TMS320C54x Family," Texas Instruments Application Note (Jun. 1996).

Janweijer et al., "A Compact Robin Using the SHarc (CRUSH)," Obtained from: http://www.nikhef.nl/~peterj/Crush/CRUSH-hw.pdf (Sep. 1998).

Kim et al, "Implementation of Convolutional Encoder and Viterbi Decoder for Wideband CDMA PCS Baseband Processing Unit Using Multiple TMS320C40s,".

Matache et al., "Trellis Coding for Diagonally Layered Space-Time Systems,".

Paaske et al., "High Speed Viterbi Decoder Architecture," First ESA Workshop on Tracking, Telemetry and Command Systems, ESTEC (Jun. 1998).

Rajagopalan et al., "A Flexible Multiplication Unit for an FPGA Logic Block," *Circuits and Systems* 4:546-9 (2001).

Xilinx Data Book 1998.

Xilinx Virtex 1.1 1998.

Xilinx Virtex 2.2 2000.

Yeo et al., "Implementation of High Throughput Soft Output Viterbi Decoders," Proc. IEEE Workshop on Signal Processing Systems pp. 146-151 San Diego CA (Oct. 2002).

Abnous et al., "Ultra-Low-Power Domain-Specific Multimedia Processors," VLSI Signal Processing, IX, 1998, IEEE Workshop in San Francisco, CA, USA, Oct. 30-Nov. 1, 1998, pp. 461-470 (Oct. 30, 1998).

Aggarwal et al.., "Efficient Huffman Decoding," International Conference on Image Processing IEEE 1:936-939 (Sep. 10-13, 2000).

Allan et al., "Software Pipelining," ACM Computing Surveys, 27(3):1-78 (Sep. 1995).

Alsolaim et al., "Architecture and Application of a Dynamically Reconfigurable Hardware Array for Future Mobile Communication Systems," Field Programmable Custom Computing Machines, 2000 IEEE Symposium, Napa Valley, Los Alamitos, CA. IEEE Comput. Soc. pp. 205-214 (Apr. 17-19, 2000).

Ashenden et al., "The VHDL Cookbook," Dept. Computer Science, University of Adelaide, South Australia. Downloaded from http:// tams-www.informatik.uni-hamburg.de/vhdl/doc/cookbook/VHDL-Cookbook.pdf on Dec. 7, 2006 (Jul. 1990).

Bacon et al., "Compiler Transformations for High-Performance Computing," ACM Computing Surveys 26(4):368-373 (Dec. 1994).

Balasubramonian et al., "Reducing the Complexity of the Register File in Dynamic Superscalar Processors," Proceedings of the 34th Annual ACM/IEEE International Symposium on Microarchitecture, pp. 237-248 (Dec. 1, 2001).

Banerjee et al., "A MATLAB Compiler for Distributed, Heterogeneous, Reconfigurable Computing Systems," 2000 IEEE Symposium, pp. 39-48, (Apr. 17-19, 2000).

Bapte et al., "Uniform Execution Environment for Dynamic Reconfiguration," Darpa Adaptive Computing Systems, http:/ /isis.vanderbilt.edu/publications/archive/babty_T_#_0_1999_Uniform_Ex.pdf, pp. 1-7 (1999).

Baumgarte et al., "PACT XPP—A Self-Reconfigurable Data Processing Architecture," NN www.pactcorp.com/sneu/download/ersa01.pdf; retrieved on Nov. 25, 2005 (Jun. 25, 2001).

Becker et al., "An Application-Tailored Dynamically Reconfigurable Hardware Architecture for Digital Baseband Processing," IEEE Conference Proceedings Article pp. 341-346 (Sep. 18, 2000).

Becker et al., "Design and Implementation of a Coarse-Grained Dynamically Reconfigurable Hardware Architecture," VLSI 2001, Proceedings IEEE Computer Soc. Workshop, Piscataway, NJ, USA, pp. 41-46 (Apr. 19-20, 2001).

BevStar, BevStar Bottled Water Model Advertisement *Automatic Merchandiser* at www.AMonline.com (2005).

BevStar, BevStar Point of Use Water Model Advertisement *Automatic Merchandiser* at www.AMonline.com (2005).

Bishop & Loucks, "A Heterogeneous Environment for Hardware/Software Cosimulation," Proceedings of the 30th Annual Simulation Symposium, pp. 14-22 (Apr. 7-9, 1997).

Brakensiek et al., "Re-Configurable Multi-Standard Terminal for Heterogeneous Networks," Radio and Wireless Conference, Rawcon 2002 IEEE. pp. 27-30 (2002).

Brown et al., "Quick PDA Data Exchange," PC Magazine pp. 1-3 (May 22, 2001).

Buck et al., "Ptolemy: A Framework for Simulating and Prototyping Heterogeneous Systems," International Journal of Computer Simulation 4:155-182 (Apr. 1994).

Burns et al., "A Dynamic Reconfiguration Run-Time System," Proceedings of the 5th Annual Symposium on Field-Programmable Custom Computing Machines, pp. 166-175 (Apr. 16, 1997).

Business Wire, "Whirlpool Internet-Enabled Appliances to Use Beeline Shopper Software Features," http://www.whirlpoocorp.com/news/releases/release.asp?rid=90 (Feb. 16, 2001).

Buttazzo et al., "Optimal Deadline Assignment for Scheduling Soft Aperiodic Tasks in Hard Real-Time Environments," Engineering of Complex Computer Systems, Proceedings of the Third IEEE International Conference on Como, pp. 39-48 (Sep. 8, 1997).

Callahan et al., "Adapting Software Pipelining for Reconfigurable Computing," in Proceedings of the International Conference on Compilers, Architectrue and Synthesis for Embedded Systems p. 8, ACM (CASES '00, San Jose, CA) (Nov. 17-18, 2000).

Chapman & Mehrotra, "OpenMP and HPF: Integrating Two Paradigms," Proceedings of the 4th International Euro-Par Conference (Euro-Par'98), Springer-Verlag Heidelberg, Lecture Notes in Computer Science 1470:650-658 (1998).

Chen et al., "A Reconfigurable Multiprocessor IC for Rapid Prototyping of Algorithmic-Specific High-Speed DSP Data Paths," IEEE Journal of Solid-State Circuits, IEEE 35:74-75 (Feb. 1, 2001).

Clarke, "Embedded Solutions Enters Development Pact with Marconi," EETimes Online (Jan. 26, 2000).

Compton & Hauck, "Reconfigurable Computing: A Survey of Systems and Software," ACM Press, ACM Computing Surveys (CSUR) 34(2):171-210 (Jun. 2002).

Compton et al., "Configuration Relocation and Defragmentation for Run-Time Reconfigurable Computing," Northwestern University, http://citeseer.nj.nec.com/compton00configuration.html, pp. 1-17 (2000).

Conte et al., "Dynamic Rescheduling: A Technique for Object Code Compatibility in VLIW Architectures," Proceedings of the 28th Annulal International Symposium on Microarchitecture pp. 208-218 (Nov. 29, 1995).

Conte et al., "Instruction Fetch Mechanisms for VLIW Architectures with Compressed Encodings," Proceedings of the Annual IEEE/ACM International Symposium on Microarchitecture (MICRO) 29:201-211 (Dec. 2, 1996).

Cray Research Inc., "Cray T3E Fortran Optimization Guide," Ver. 004-2518-002, Section 4.5 (Jan. 1999).

Cummings et al., "FPGA in the Software Radio," IEEE Communications Magazine . 37(2):108-112 (Feb. 1999).

Dandalis et al., "An Adaptive Cryptograhic Engine for IPSec Architectures," IEEE pp. 132-141 (Jan. 2000).

David et al., "DART: A Dynamically Reconfigurable Architecture Dealing with Future Mobile Telecommunication Constraints," Proceedings of the International Parallel and Distributed Processing Symposium pp. 156-163 (Apr. 15, 2002).

Deepakumara et al., "FPGA Implementation of MD5 has Algorithm," Canadian Conference on Electrical and Computer Engineering, IEEE (2001).

Dehon et al., "Reconfigurable Computing: What, Why and Implications for Design Automation," Design Automation Conference Proceedings pp. 610-615 (1999).

Dipert, "Figuring Out Reconfigurable Logic," EDN 44(16):107-114 (Aug. 5, 1999).

Dominikus, "A Hardware Implementation of MD4-Family Hash Algorithms," 9th International Conference on Electronics, Circuits and Systems IEEE (2002).

Dorband, "aCe C Language Reference Guide," Online (Archived Mar. 2001), http://web.archive.org/web/20000616053819/http://newton.gsfc.nasa.gov/aCe/aCe_dir/aCe_cc_Ref.html (Mar. 2001).

Drozdowski, "Scheduling Multiprocessor Tasks—An Overview," Instytut Informatyki Politechnika, pp. 1-31 (Jan. 31, 1996).

Ebeling et al., "RaPiD Reconfigurable Pipelined Datapath," Springer-Verlag, 6th International Workshop on Field-Programmable Logic and Applications pp. 126-135 (1996).

Fawer et al., "A Multiprocessor Approach for Implementing a Time-Diversity Spread Specturm Receiver," Proceeding sof the 1990 International Zurich Seminal on Digital Communications, pp. 173-180 (Mar. 5-8, 1990).

Fisher, "Gone Flat," Forbes pp. 76-79 (Oct. 2001).

Fleischmann et al., "Prototyping Networked Embedded Systems," Integrated Engineering, pp. 116-119 (Feb. 1999).

Forbes "Best of the Web—Computer Networking/Consumer Durables," *The Forbes Magnetic 40* p. 80 (May 2001).

Gibson, "Fresh Technologies Will Create Myriad Functions," FT Information Technology Review; World Wide Web at http://technews.acm.org/articles/2000-2/0301w.html?searchterm=%22fresh+technologies%22 (Mar. 1, 2000).

Gluth, "Integrierte Signalprozessoren," Elektronik 35(18):112-118 Franzis Verlag GMBH, Munich, Germany (Sep. 5, 1986).

Gokhale & Schlesinger, "A Data Parallel C and Its Platforms," Proceedings of the Fifth Symposium on the Frontiers of Massively Parallel Computation pp. 194-202 (Frontiers '95) (Feb. 1995).

Grimm et al., "A System Architecture for Pervasive Computing," Washington University, pp. 1-6 (Sep. 2000).

Halbwachs et al., "The Synchronous Data Flow Programming Language LUSTRE," Proceedings of the IEEE 79(9):1305-1319 (Sep. 1991).

Hammes et al., "Cameron: High Level Language Compilation for Reconfigurable Systems," Proc. of the Intl. Conf. on Parallel Architectures and Compilation Techniques, pp. 236-244 (Oct. 1999).

Hartenstein, "Coarse Grain Reconfigurable Architectures," Design Automation Conference, 2001. Proceedings of the ASP-Dac 2001, Asian and South Pacific Jan. 30, 2001-Feb. 2, 2001, Piscataway, Nj, US, IEEE, pp. 564-569 (Jan. 30, 2001).

Heinz, "An Efficiently Compilable Extension of {M}odula-3 for Problem-Oriented Explicitly Parallel Programming," Proceedings of the Joint Symposium on Parallel Processing (May 1993).

Hinden et al., "The DARPA Internet: Interconnecting Heterogeneous Computer Networks with Gateways," IEEE Computer Magazine pp. 38-48 (1983).

Horton, "Beginning Java 2: JDK 1.3 Edition," Wrox Press, Chapter 8, pp. 313-316 (Feb. 2001).

Huff et al., "Lifetime-Sensitive Modulo Scheduling," 6th Conference on Programming Language, Design and Implementation, pp. 258-267, ACM (1993).

IBM, "Multisequencing a Single Instruction Stream Scheduling with Space-time Trade-offs," IBM Technical Disclosure Bulletin 36(2):105-108 (Feb. 1, 1993).

IEEE, "IEEE Standard Verilog Hardware Description Language," downloaded from http://inst.eecs.berkeley.edu/~cs150/fa06/Labs/verilog-ieee.pdf on Dec. 7, 2006 (Sep. 2001).

Internet Wire, Sunbeam Joins Microsoft in University Plug and Play Forum to Establish a "Universal" Smart Appliance Technology Standard (Mar. 23, 2000).

Ishii et al., "Parallel Variable Length Decoding with Inverse Quantization for Software MPEG-2 Decoders," Workshop on Signal Processing Systems, Design and Implementation, IEEE pp. 500-509 (Nov. 3-5, 1997).

Isoworth, "Isoworth Beverage Dispensing Technology Worldwide Company," Brochure (May 22, 2000).

Jain et al., "An Alternative Approach Towards the Design of Control Units," Microelectronics and Reliability 24(6):1009-1012 (1984).

Jain, "Parallel Processing with the TMS320C40 Parallel Digital Signal Processor," Sonitech International Inc., pp. 13-46. Retrieved from: http://www-s.ti.com/sc/psheets/spra031/spra031.pdf retrieved on Apr. 14, 2004 (Feb. 1994).

Janssen et al., "Partitioned Register File for TTAs," Proceedings of the 28th Annual International Symposium on Microarchitecture, pp. 303-312 (Nov. 1995).

Jong-Pyng et al., "Real-Time Virtual Channel Flow Control," Proceedings of the Annual International Phoenix Conference on Computers and Communications, Conf. 13, pp. 97-103 (Apr. 12, 1994).

Jung et al., "Efficient Hardware Controller Synthesis for Synchronous Dataflow Graph in System Level Design," Proceedings of the 13th International Symposium on System Synthesis pp. 79-84 (ISSS'00) (Sep. 2000).

Kaufmann et al., "Digital Spread-Spectrum Multipath-Diversity Receiver for Indoor Communication," from Pioneers to the 21st Century; Denver, Proceedings of the Vehicular Technology Socity [sic] Conference, NY, IEEE, US 2(Conf. 42):1038-1041 (May 10-13, 1992).

Kneip et al., "An Algorithm Adapted Autonomous Controlling Concept for a Parallel Single-Chip Digital Signal Processor," Journal of VLSI Signal Processing Systems for Signal, Image, an dVideo Technology 16(1):31-40 (May 1, 1997).

Lee & Messerschmitt, "Pipeline Interleaved Programmable DSP's: Synchronous Data Flow Programming," IEEE Transactions on Acoustics, Speech, and Signal Processing ASSP-35(9):1334-1345 (Sep. 1987).

Lee & Messerschmitt, "Synchronous Data Flow," Proceedings of the IEEE 75(9):1235-1245 (Sep. 1987).

Lee & Parks, "Dataflow Process Networks," Proceedings of the IEEE 83(5):773-799 (May 1995).

Liu et al., "Scheduling Algorithms for Multiprogramming in a Hard-Real-Time Environment," *Journal of the Association for Computing* 20(1):46-61 (1973).

Llosa et al., "Lifetime-Sensitive Modulo Scheduling in a Production Environment," IEEE Trans. on Comps. 50(3):234-249 (Mar. 2001).

Lu et al., "The Morphosys Dynamically Reconfigurable System-On-Chip," Proceedings of the First NASA/DOD Workshop on Evolvable Hardware, pp. 152-160 (Jul. 19, 1999).

Mangione-Smith et al., "Seeking Solutions in Configurable Computing," *Computer* 30(12):38-43 (Dec. 1997).

Manion, "Network CPU Adds Spice," Electronic Engineering Times, Issue 1126 (Aug. 14, 2000).

Mascia & Ishii., "Neural Net Implementation on Single-Chip Digital Signal Processor," IEEE (1989).

McGraw, "Parallel Functional Programming in Sisal: Fictions, Facts, and Future," Lawrence Livermore National Laboratory pp. 1-40 (Jul. 1993).

Najjar et al., "High-Level Language Abstraction for Reconfigurable Computing," *Computer* 36(8):63-69 (Aug. 2003).

Nichols et al., "Data Management and Control-Flow Constructs in a SIMD/SPMD Parallel Language/Compiler," Proceedings of the 3rd Symposium on the Frontiers of Massively Parallel Computation pp. 397-406 (Oct. 1990).

OpenMP Architecture Review Board, "OpenMP C and C++ Application Program Interface," pp. 7-16 (Oct. 1998).

Oracle Corporation, "Oracle8i JDBC Developer's Guide and Reference," Release 3, 8.1.7, pp. 10-8-10-10 (Jul. 2000).

Pauer et al., "Algorithm Analysis and Mapping Environment for Adaptive Computing Systems: Further Results," Proc. IEEE Symposium on FPGA's for Custom Computing Machines (FCCM), Napa CA (1999).

Pauer et al., "Algorithm Analysis and Mapping Environment for Adaptive Computing Systems," Presentation slides, Third Bi-annual Ptolemy Miniconference (1999).

Ramamritham et al., "On Scheduling Algorithms for Real-Time Multiprocessor Systems," Algorithms and Applications, Proceedings of the International conference on Parallel Processing 3:143-152 (Aug. 8, 1989).

Schneider, "A Parallel/Serial Trade-Off Methodology for Look-Up Table Based Decoders," Proceedings of the Design Automation Conference 34:498-503 (Jun. 9-13, 1997).

Sidhu et al., "A Self-Reconfigurable Gate Array Architecture," 10 International Workshop on Field Programmable Logic and Applications http://coblitz.codeen.org:3125/citeseer.ist.psu.edu/cache/papers/cs/17524/http:zSzzSz maarcii.usc.eduzSzPublicationsZSzsidhu_fp100.pdf/sidhu00selfreconfigurable.pdf retrieved on Jun. 21, 2006 (Sep. 1, 2001).

Smith, "Intro to ASICs: ASIC Cell Libraries," at http://iroi.seu.edu.cn/books/asics/Book2/CH01/CH01.5.htm, printed on Feb. 4, 2005 (Jun. 1997).

Souza, "Computing's New Face—Reconfigurable Devices Could Rattle Supply Chain," Electronic Buyers' News Issue 1205, p. P.1 (Apr. 3, 2000).

Souza, "Quicksilver Buys White Eagle," Electronic Buyers News, Issue 1220 (Jul. 17, 2000).

Sriram et al., "MPEG-2 Video Decoding on the TMS320C6X DSP Architecture," Conference Record of the 32nd Asilomar Conference on Signals, Systems, and Computers, IEEE pp. 1735-1739 (Nov. 1-4, 1998).

Steiner, "Coke Chief's Latest Daft Idea—A Cola Tap in Every House," Sunday Times (Mar. 2001).

Sun Microsystems, "FORTRAN 3.0.1 User's Guide, Revision A," pp. 57-68 (Aug. 1994).

Svensson, "Co's Join on Home Web Wiring Network," Associated Press Online printed on Apr. 30, 2008 (Jun. 2000).

Tang et al., "Thread Partitioning and Scheduling Based on Cost Model," Proceedings of the Ninth Annual ACM Symposium on Parallel Algorithms and Architectures, pp. 272-281 Retrieved from: http://doi.acm.org/10.1145/258492.2585 retrieved on Aug. 25, 2004 (1997).

Vaya, "Viturbo: A Reconfigurable Architecture for Ubiquitous Wireless Networks," A Thesis Submitted in Partial Fulfillment of the Requirements for the Degree Master of Science; Rice University (Aug. 2002).

Wang et al., "Cell Search in W-CDMA," IEEE Journal on Selected Areas in Communications 18(8):1470-1482 (Aug. 2000).

Wardell, "Help for Hurried Cooks?," Popular Science, p. 32 (May 2000).

Whiting & Pascoe, "A History of Data-Flow Languages," IEEE Annals of the History of Computing 16(4):38-59 (1994).

Williamson & Lee, "Synthesis of Parallel Hardware Implementations from Synchronous Dataflow Graph Specifications," Conference Record of the Thirtieth Asilomar Conference on Signals, Systems and Computers 1340-1343 (Nov. 1996).

Wirthlin et al., "A Dynamic Instruction Set Computer," Proceedings of the IEEE Symposium on FPGA's for Custom Computing Machines, pp. 99-107 (Apr. 21, 1995).

www.appliancemagazine.com, World Wide Web at http://web.archive.org/web/20000511085402/http://www.appliancemagazine.com/printed on Apr. 30, 2008.

www.bestrom.com, BreakMateTM from www.bestrom.com printed on Apr. 29, 2008.

www.beverageexpress.com, Beverage Express from www.beverageexpress.com printed on Apr. 30, 2008.

www.bevstar.com, Isoworth Beverage Dispensing Technology Worldwide from www.bevstar.com printed on Apr. 30, 2008.

www.bonator.com, from The World Wide Web at http://web.archive.org/web/20000510102440/http://www.bonator.com/ printed on Apr. 30, 2008.

www.ecommerce.dewpointinc.com, Swiss Mountain Coffees from www.ecommerce.dewpointinc.com printed on Apr. 30, 2008.

www.gateway.com, World Wide Web, http://web.archive.org/web/20000229192734/www.gateway.com/productpages/9300splash/index.shtml Available on Mar. 3, 2000, 1 page (Mar. 3, 2000).

www.icl.com, from the World Wide Web at http.//www.icl.com printed on Apr. 30, 2008.

www.margherita2000.com; from Margherita2000.com printed Apr. 30, 2008 (Jan. 26, 2001).

www.sodaclubenterprises.com, Soda-Club Enterprises from www.sodaclubenterprises.com printed on Apr. 30, 2008.

www.symbol.com, Symbol from www.symbol.com printed on Apr. 30, 2008.

www.wunderbar.com, Wunder-Bar Dispensing Systems from www.wunderbar.com printed on Apr. 30, 2008.

Xilinx, "Virtex-II Pro Platform FPGAs: Functional Description DS083-2 (v2.5)," Product Specification, pp. 13-46 (Jan. 20, 2003).

Young, "Architecture Powers up IPSec, SSL," EETimes, Los Gatos, CA, pp. 1-4 http://www.eetimes.com/story/OEG20011102S0065 (Nov. 2, 2001).

Yuan et al., "A Decomposition Approach to Non-Preemptive Real-Time Scheduling," Real Time Systems 6(1):7-35 (1994).

Zaino et al., "Algorithm Analysis and Mapping Environment for Adaptive Computing Systems," Final Technical Report, DARPA Contract F33615-97-C-1174 (Sep. 2001).

Zhang et al., "A 1V Heterogeneous Reconfigurable Processor IC for Baseband Wireless Applications," 2000 IEEE Solid.

* cited by examiner

ADAPTIVE COMPUTING ENGINE (ACE)

FIG. 5

| DATA AND OTHER PARAMETERS: | FUNCTIONS/INPUT OPERAND DATA SET ||||||| 
|---|---|---|---|---|---|---|---|
| | f1/1 | f1/2 | f2/1 | f2/2 | f3/1 | f3/2 | ... |
| STATIC DATA LOCATION | - | - | - | - | - | - | ... |
| INPUT DATA SIZE | - | - | - | - | - | - | ... |
| OUTPUT DATA SIZE | - | - | - | - | - | - | ... |
| DATA TYPE | - | - | - | - | - | - | ... |
| DATA SOURCE LOCATION | - | - | - | - | - | - | |
| DATA DESTINATION LOCATION | - | - | - | - | - | - | |
| DATA PIPELINE LENGTH | - | - | - | - | - | - | ... |
| LOCALITY OF REFERENCE | - | - | - | - | - | - | ... |
| DISTANCE OF DATA MOVEMENT | - | - | - | - | - | - | ... |
| SPEED OF DATA MOVEMENT | - | - | - | - | - | - | |
| DATA PERSISTENCE | - | - | - | - | - | - | |
| DATA ACCESS FREQUENCY | - | - | - | - | - | - | |
| DATA LOAD/STORES | - | - | - | - | - | - | |
| CACHE USAGE | - | - | - | - | - | - | |
| REGISTER USAGE | - | - | - | - | - | - | |
| MEMORY USAGE | - | - | - | - | - | - | |
| ALGORITHMIC ELEMENT | - | - | - | - | - | - | |
| CORRESPONDING HARDWARE LOCATION | - | - | - | - | - | - | |
| MEMORY THROUGHPUT | - | - | - | - | - | - | |
| EXECUTION TIME | - | - | - | - | - | - | |
| EXECUTION FREQUENCY | - | - | - | - | - | - | |
| POWER CONSUMED | - | - | - | - | - | - | |
| NUMBER OF INSTRUCTIONS | - | - | - | - | - | - | |
| | MEASURED DATA PARAMETERS AND OTHER PROFILED RESULTS |||||||
| DATA PARAMETER COMPARATIVE RESULTS (IN DATA OPERATIONAL UNITS) | - | - | - | - | - | - | .. |
| OVERALL: - | | | | | | | |

420 — DATA AND OTHER PARAMETERS
400 — FIG. 5
410 — FUNCTIONS/INPUT OPERAND DATA SET
430 — MEASURED DATA PARAMETERS AND OTHER PROFILED RESULTS
440 — DATA PARAMETER COMPARATIVE RESULTS

PROFILING OF SOFTWARE AND CIRCUIT DESIGNS UTILIZING DATA OPERATION ANALYSES

CROSS REFERENCE TO A RELATED APPLICATION

This application is related to Paul L. Master et al., U.S. patent application Ser. No. 09/815,122, entitled "Adaptive Integrated Circuitry With Heterogeneous And Reconfigurable Matrices Of Diverse And Adaptive Computational Units Having Fixed, Application Specific Computational Elements", filed Mar. 22, 2001, now U.S. Pat. No. 6,836,839, commonly assigned to QuickSilver Technology, Inc., and incorporated by reference herein, with priority claimed for all commonly disclosed subject matter (the "related application").

FIELD OF THE INVENTION

The present invention relates in general to profiling of software and circuit designs for performance analyses and, more particularly, to profiling both software and reconfigurable and adaptive circuit designs utilizing data parameters, including data dynamics and other data operational statistics.

BACKGROUND OF THE INVENTION

Software or other computing programs, such as programs expressed in C and C++ code, have been profiled in the prior art, as a method of determining performance of the program as executed, generally using criteria such as estimated power consumption, speed of execution, code size, integrated circuit (IC) area utilized in execution, and other performance measures. Such current profiling techniques, as a consequence, have been confined largely to the processor (microprocessor) computing environment, for example, to identify algorithms which may be separately accelerated in an application specific integrated circuit (ASIC), or to provide statistics on processor or program performance.

Current profiling techniques are generally statistical or intrusive. In statistical profiling, an interrupt is generated, which then allows the capture of various register contents or counters. This type of profiling then provides statistics, such as how often the program executes a particular algorithm or routine. One widely used hardware profiler, for example, requires the user to stop the central processing unit (CPU) during program execution, and use special debugging registers to generate a profile.

Other existing profiling techniques are typically intrusive. In this method, extra lines of programming code are actually inserted periodically into the program code to be profiled. As these inserted code segments are called, hard counts may be generated, reflecting usage of a corresponding algorithm or routine.

Both statistical profiling and intrusive profiling have significant limitations. For example, depending upon the granularity or degree to which code has been inserted or interrupts generated, both methodologies may typically miss or overlook code features between such points of intrusion or interrupt.

In addition, measures of power and performance based upon such current statistical or intrusive profiling may be significantly inaccurate. Such power and performance measures are typically based upon various underlying assumptions, such as data pipeline length, and exhibit strong data dependencies, such as depending upon the sequence of logic 1s and 0s (i.e., high and low voltages) within a particular data stream. In addition, such power and performance measures also depends significantly upon program dynamics, such that statistical or intrusive profiling often provides inaccurate results compared to actual performance of the program. As a consequence, because current profiling techniques do not account for data issues and concerns, they tend to be significantly inaccurate.

Finally, the existing profilers can measure program performance in known computing architectures or processor architectures only; no profilers exist for profiling program execution for an integrated circuit that is reconfigurable or adaptive. In the reconfigurable hardware environment, the combination of hardware computational units, their interconnections, the proximity of data to these computation units, and the algorithms to be performed by the circuit, each contribute to overall efficiency of execution. Existing profiling tools do not address the impact of each of these variables.

BRIEF DESCRIPTION OF THE DRAWINGS

FIG. 5 is a graphical diagram visually illustrating a data structure embodiment in accordance with the present invention.

DETAILED DESCRIPTION OF THE INVENTION

Figure 1:
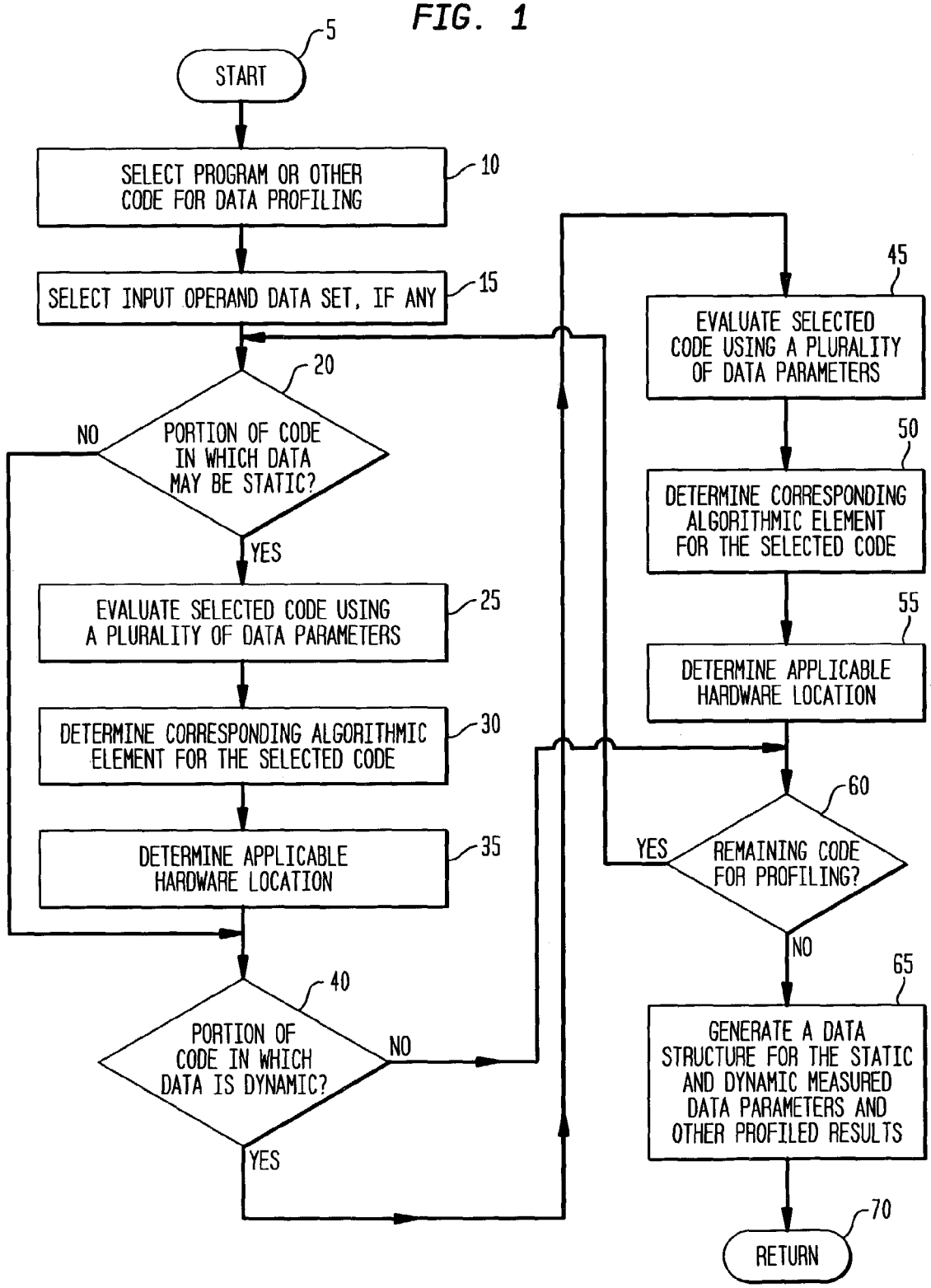
FIG. 1 is a flow diagram illustrating an exemplary method of data profiling in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

The present invention, referred to herein as the "profiler" or the "profiling tool", of the present invention, evaluates or profiles both existing (or legacy) program code (or software) and new forms of program code on the basis of a plurality of data parameters. Such a profiling tool, in accordance with the present invention, provides this profiling based upon data parameters (or data metrics) such as data location (for static data), data type, data size (input and output), data source and destination locations (for dynamic data), data pipeline length, locality of reference, distance of data movement, speed of data movement, data access frequency, number of data load/stores, degree of cache, register or memory usage, data persistence, corresponding algorithmic element, and corresponding hardware location for the algorithmic element. The profiler of the invention may also provide other measurements of resource utilization, such as memory throughput, execution time and frequency, power consumed, number of instructions utilized, and so on. The profiling tool of the present invention is especially useful in performing actual circuit design and implementation, particularly in the adaptive computing environment.

The profiler of the present invention was developed as a component in a suite of development tools for designing adaptive and reconfigurable hardware and attendant configuration information (which themselves are the subjects of the related application and other pending patent applications). This reconfigurable hardware, referred to as an adaptive computing engine ("ACE") architecture, and the other development tools, is briefly discussed with reference to FIGS. 2 and 3 and is used to establish a hardware context for the present invention.

The present invention is a method, system, tangible medium storing machine readable software, and data structure for profiling computing programs, communication programs, and other program code or other software, with respect to a plurality of data parameters. These programs would typically operate or be run in a processing environment, such as a microprocessor or digital signal processor, or operate as embedded in custom hardware such as an ASIC. In an exemplary embodiment of the invention, the profiler analyzes the code based upon the plurality of data parameters, and outputs the results in any of various forms, such as a data structure. Such data structures may embodied in a plurality of forms, such as electronically in a memory, or a visually perceptible form, such as in a graph, spreadsheet, table, or array.

It should be noted that the terminology such as "program", "code", "program code", or "software" are used interchangeably herein and are to be construed broadly to cover and include any type of programming language which has been arranged or ordered such that, when executed, a particular function is performed. For example, the code to be profiled may be a computing program, such as software or operating systems used with a computer or workstation, or a communication program, such as the International Telecommunications Union (ITU) programs or code for cellular, CDMA, GSM, or 3G communications, including legacy ITU code which often is the actual promulgated definition of a communication function to be performed to be compliant with an ITU standard. Other code types may include the code utilized in the International Electrical and Electronic Engineers (IEEE) standards, such as IEEE 802.11 for wireless LANs, or code which is under development or which is to be developed, such as code for software defined radios, and so on.

The profiler of the invention is of particular use in transforming this program code for use in an adaptive and reconfigurable computing environment by, for example, selecting algorithmic elements from the code for performance on various computational elements of the adaptive computing architecture and determining the locations of these computational elements within the ACE architecture based on, among other things, the profiled data parameter results (also referred to as measured data parameters which are combined to form data parameter comparative results). In another exemplary embodiment of the invention, the profiler accepts, as inputs, various hardware descriptions of the adaptive computing architecture, and program code or software which would otherwise typically be run in a processor-based environment. The profiler analyzes the code based upon the plurality of data parameters, and using the profiled data parameter results, selects portions of the profiled code for conversion into a form so that its corresponding functions or algorithmic elements may be executed on the ACE architecture directly by corresponding selected computational elements. These profiling statistics are calculated iteratively, as portions of code are identified for execution of corresponding functions in the adaptive computing architecture, and subsequently removed from the software code. The process is repeated until optimal performance of the ACE architecture (with its adapting configuration) is achieved.

Another unique feature of the present invention is a "self-profiling" capability in the adaptive computing architecture. As discussed in greater detail below, the adaptive computing engine ("ACE") architecture is configurable and reconfigurable, with actual input connections and output connections between and among constituent computational elements being changeable, in real time, to perform different functions as needed, to provide the overall operating mode of the adaptive computing architecture. For example, computational elements such as adders and multipliers, which were performing a discrete cosine transformation (DCT), may be reconfigured to perform a fast Fourier transformation (FFT). As a consequence of this reconfiguration capability, a profiler may be included within the ACE, with the profiler operating upon the actual circuit design or structure of the ACE as it is operating. As the ACE operates, it may determine that, based upon the profiled data parameter results, it should change or modify its configuration for performance of one or more functions or operations. For example, based upon profiled data parameter results such as distance of data movement, the ACE may reconfigure itself by providing additional data memory in closer proximity to the area of its circuit performing a corresponding calculation.

The profiler of the invention utilizes the plurality of data parameters as one form of measurement of performance, indicative of resource utilization, speed of operation, power utilization, and so on. Such performance may be evaluated on one or more levels, such as "coarse grain" performance metrics at the program language function level, and "fine grain" statistics at the CPU instruction level or other hardware level.

In the various exemplary embodiments, the plurality of data parameters may include one or more of the following parameters, in addition to other forms of data measurement:
  data location (for static data), such as a memory or register location;
  data type, such as input data, intermediate calculation data, output data, other forms of operand data, and so on;
  data size (input and output), such as number of bits, bandwidth required (bus or interconnect width), which may also be a function of or otherwise related to data type;
  data source and destination locations (for dynamic data), such as memory or register locations;
  data pipeline length, such as how long a data stream is;
  locality of reference, such as how far the data is from the computing elements which will process or use it;
  distance of data movement (for dynamic data), such as a distance between various caches, registers, or other memory locations, and/or the distance the data moves between or among the lines of code being profiled;
  speed of data movement (for dynamic data), namely, how fast was the data able to be moved from a source location to a computing element and/or to a destination location, such as the number of computation cycles utilized in the data transfer;
  data access frequency, such as how often was the data accessed;
  data loads and stores (load/stores) into registers, caches or other memory;
  degree of cache, register or memory usage; and
  data persistence, such as how long did the data remain in use, either unchanged or as (repeatedly) modified and used.

In addition, the measured data parameters, as profiled data parameter results, may be combined in various ways, such as by a weighted function, to produce an overall, comparative result (referred to as a data parameter comparative result), defining a new unit of measure referred to as a "data operational unit", as discussed in greater detail below. Various sets of profiled data parameter results may be generated, with corresponding data operational units, based upon various hardware architectures, based upon corresponding algorithms or algorithmic elements, and based upon various input data sets. Using the comparative data operational units, an optimal architecture may be selected, with a corresponding set of optimal profiled data parameter results.

FIG. 1 is a flow diagram illustrating an exemplary method of data profiling in accordance with the present invention. The method begins, start step 5, with the selection of a program or other code for data parameter profiling, step 10, and the selection of an input operand data set (if any), to be utilized by the program or other code, step 15. Steps 10 and 15 are not order-dependent, that is, they may occur in either order, as is true of most of the method steps below. The method then determines and identifies one or more portions of the code in which data may remain static, that is, the data need not move from one memory location to another during processing or other code execution, such as from one register or memory to another memory or register, step 20. When data which may remain static has been determined or identified in step 20, the method proceeds to step 25, to evaluate the selected code portion using one or more of the plurality of data parameters, providing a corresponding plurality of measured data parameters. When the code portion does not utilize static data, the method may proceed to step 40.

In step 25, not all of the plurality of data parameters may be applicable. For example, the data parameters for source and destination locations would be inapplicable, as the data used in this code portion does not move to a destination location. Data parameters which are applicable, among others, include data location, data type, data size (input and output), data pipeline length, locality of reference, data access frequency, number of data load/stores, degree of cache, register or memory usage, and data persistence. In the event that data location may be determined as a code location rather than an IC location, the code location may also be mapped to an IC location, as part of step 25 or as a separate step.

Also for static data, the profiling methodology determines the corresponding algorithmic element (or function or operation) involving the static data, step 30, such as a multiply, divide, add, subtract, accumulate, multiply-and-accumulate, and so on. In addition, the method determines an applicable hardware location, if any, for execution or performance of the algorithmic element, step 35, such as a location of a computational element for an ACE embodiment, or a location within a microprocessor.

Following step 35, or when there is no data which may remain static determined or identified in step 20, the method proceeds to evaluate the selected code portion using the plurality of data parameters for dynamic data, that is, data which does move from one location to another during processing or other execution, step 40. When dynamic data has been identified or determined in step 40, the profiling methodology evaluates the selected code portion using one or more of the plurality of data parameters, step 45, such as determining the source (from) and destination (to) locations of the data, data type, data size (input and output), data pipeline length, locality of reference, distance of data movement, speed of data movement, data access frequency, number of data load/ stores, degree of cache, register or memory usage, and data persistence, and provides a corresponding plurality of measured data parameters. As mentioned above, if the source and destination locations are determined as locations within the code, they also may be mapped to source and destination locations within an IC, in this or another step. For the particular identified dynamic data for the selected code portion, the profiling methodology determines the corresponding algorithmic element or function involving the dynamic data, step 50, also such as a multiply, divide, add, subtract, accumulate, multiply-and-accumulate, and so on. In addition, the method determines an applicable hardware location, if any, for execution or performance of the algorithmic element, step 55, such as a location of a computational element for an ACE embodiment, or a location within a microprocessor.

Following step 55, or when there is no dynamic data determined or identified in step 40, the method proceeds to step 60, and determines whether there is any remaining code (or program) for profiling. When there is remaining code in step 60, the method returns to step 20, and continues to iterate until there is no code remaining for profiling. In lieu of returning to step 20, the method may also return to step 15, if one or more additional input operand data sets are needed, and then continue to iterate until there is no code remaining for profiling.

Not separately illustrated in FIG. 1, a program may also be profiled for resource utilization, based upon the plurality of data parameters, independently of any assumption of an underlying hardware utilized for execution, with all locations and distances based upon code locations, and generally with a more limited set of data parameters used in the evaluation.

When there is no code remaining for profiling in step 60, the methodology generates the complete results of the data profiling, such as the measured data parameters (also referred to as profiled data parameter results), and preferably also the data parameter comparative results (derived from the measured data parameters, as discussed below), and provides these results in a data structure form, step 65. In step 65, the method generates a selected data structure or other representation of the profiled data parameter results, such as a graphical or tabular representation, a spreadsheet, a multidimensional array, a database, a data array stored in a memory or other machine-readable medium, or another form of data structure. As indicated above, the measured data parameters (or profiled data parameter results) may be combined to form data parameter comparative results which are expressed in data operational units, as comparative, numerical values. An exemplary data structure, as a visually perceptible structure, is illustrated as a two-dimensional array in FIG. 5. Following such result generation, the method may end, return step 70.

With regard to the methodology illustrated in FIG. 1, it should be noted that many of the steps are order independent and may occur in any order, without departing from the spirit and scope of the present invention. For example, the dynamic and static data determinations, and their corresponding steps, may occur in a wide variety of orders and in a wide variety of ways. Similarly, the generation of results may also occur in a wide variety of ways and in a wide variety of orders, such as following each iteration, or periodically, rather than at the end of the profiling process. All such variation are considered equivalent to the method illustrated in FIG. 1.

The methodology of the present invention is particularly suitable for adaptation of existing or legacy code, such as C or C++ code, for the adaptive computing architecture. In addition, the profiling of the present invention is also suitable for new forms of code or programming, including code based upon programming languages designed for the adaptive computing engine.

Figure 2:
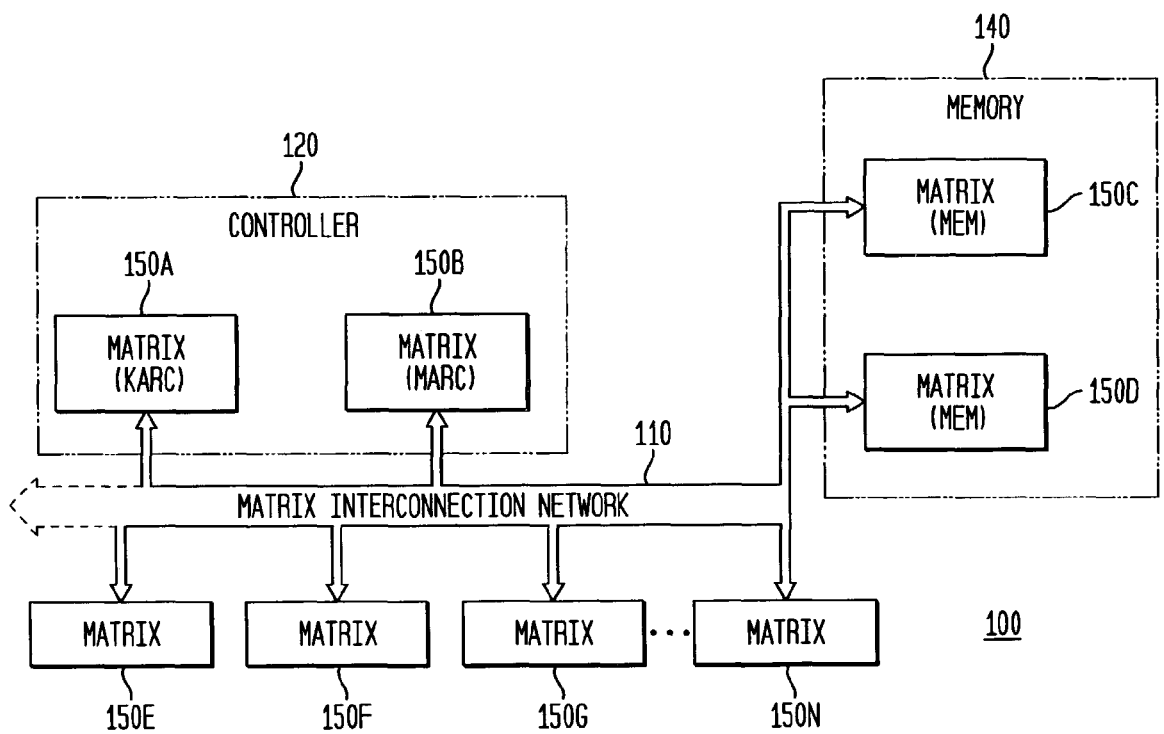
FIG. 2 is a block diagram illustrating an exemplary apparatus embodiment, referred to as the ACE architecture, in accordance with the invention of the related application.

FIG. 2 is a block diagram illustrating an adaptive computing engine (ACE) 100 of the invention of the related application, which is preferably embodied as an integrated circuit, or as a portion of an integrated circuit having other, additional components. (The ACE 100 is also described in detail in the related application.) In the exemplary embodiment, and as discussed in greater detail below, the ACE 100 includes one or more reconfigurable matrices (or nodes) 150, such as matrices 150A through 150N as illustrated, and a matrix interconnection network (MIN) 110. Also in the exemplary embodiment, and as discussed in detail below, one or more of the matrices 150, such as matrices 150A and 150B, are configured for functionality as a controller 120, while other matrices, such as matrices 150C and 150D, are configured for functionality as a memory 140. While illustrated as separate matrices 150A through 150D, it should be noted that these control and memory functionalities may be, and preferably are, distributed across a plurality of matrices 150 having additional functions to, for example, avoid any processing or memory "bottlenecks" or other limitations. The various matrices 150 and matrix interconnection network 110 may also be implemented together as fractal subunits, which may be scaled from a few nodes to thousands of nodes. Depending upon the selected embodiment, a processor (such as a microprocessor or digital signal processor (DSP) may be included with the ACE 100 in a larger apparatus or system embodiment.

A significant departure from the prior art, the ACE 100 does not utilize traditional (and typically separate) data, direct memory access (DMA), random access, configuration and instruction busses for signaling and other transmission between and among the reconfigurable matrices 150, the controller 120, and the memory 140, or for other input/output ("I/O") functionality. Rather, data, control and configuration information are transmitted between and among these matrix 150 elements, utilizing the matrix interconnection network 110, which may be configured and reconfigured, to provide any given connection between and among the reconfigurable matrices 150, including those matrices 150 configured as the controller 120 and the memory 140, as discussed in greater detail below.

It should also be noted that once configured, the MIN 110 also and effectively functions as a memory, directly providing the interconnections for particular functions, until and unless it is reconfigured. In addition, such configuration and reconfiguration may occur in advance of the use of a particular function or operation, and/or may occur in real-time or at a slower rate, namely, in advance of, during or concurrently with the use of the particular function or operation. Such configuration and reconfiguration, moreover, may be occurring in a distributed fashion without disruption of function or operation, with computational elements in one location being configured while other computational elements (having been previously configured) are concurrently performing their designated function.

The matrices 150 configured to function as memory 140 may be implemented in any desired or preferred way, utilizing computational elements (discussed below) of fixed memory elements, and may be included within the ACE 100 or incorporated within another IC or portion of an IC. When the memory 140 is included within the ACE 100, it may be comprised of computational elements which are low power consumption random access memory (RAM), but also may be comprised of computational elements of any other form of memory, such as flash, DRAM, SRAM, SDRAM, MRAM, FeRAM, ROM, EPROM or E$^2$PROM. As mentioned, this memory functionality may also be distributed across multiple matrices 150, and may be temporally embedded, at any given time, as a particular MIN 110 configuration. In addition, the memory 140 may also include DMA engines, not separately illustrated.

The controller 120 may be implemented, using matrices 150A and 150B configured as adaptive finite state machines, as a reduced instruction set ("RISC") processor, controller or other device or IC capable of performing the two types of functionality discussed below. The first control functionality, referred to as "kernel" control, is illustrated as kernel controller ("KARC") of matrix 150A, and the second control functionality, referred to as "matrix" control, is illustrated as matrix controller ("MARC") of matrix 150B.

Figure 3:
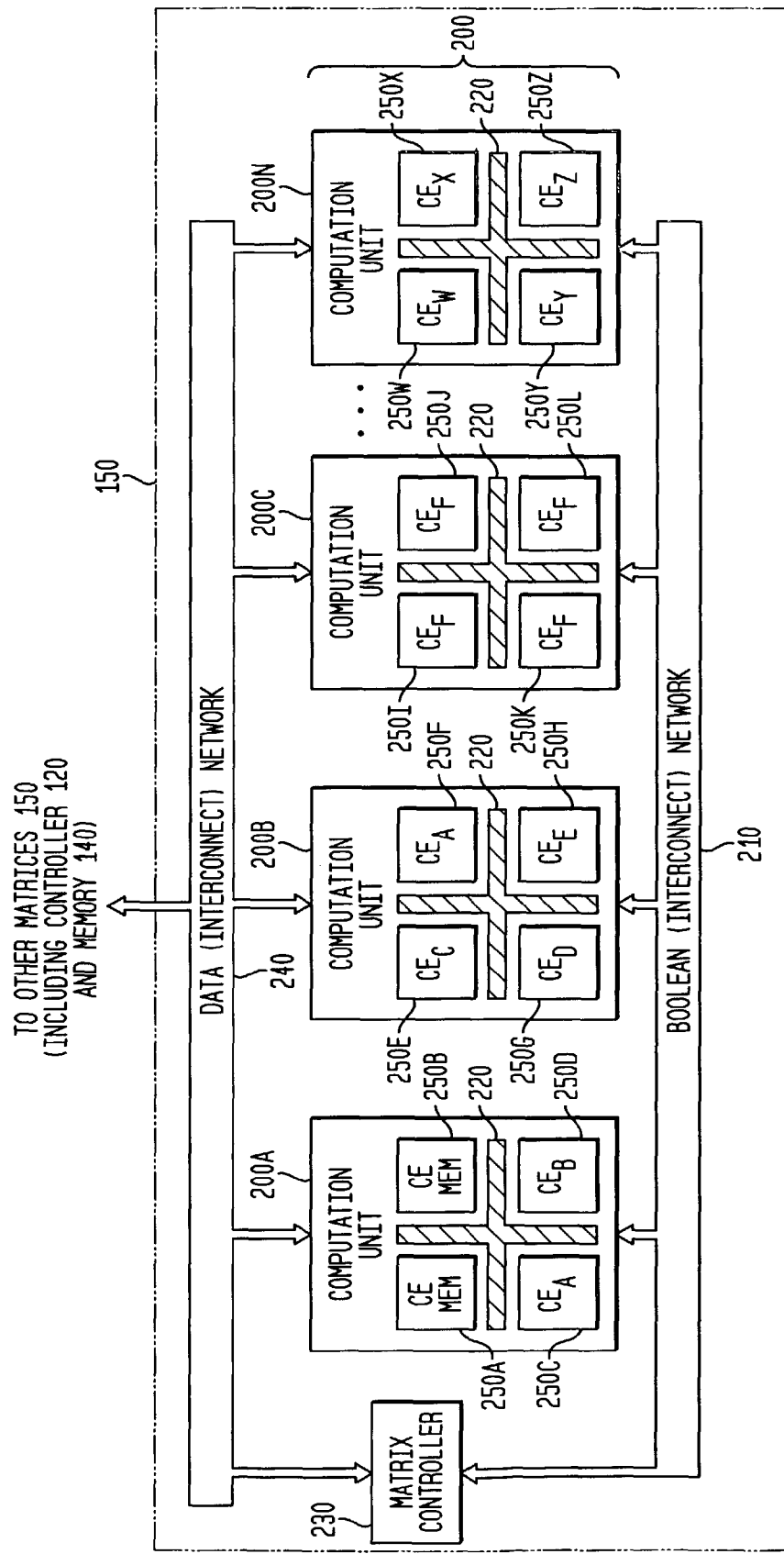
FIG. 3 is a block diagram illustrating a reconfigurable matrix, a plurality of computation units, and a plurality of computational elements of the ACE architecture, in accordance with the invention of the related application.

The matrix interconnection network 10 of FIG. 2, and its subset interconnection networks separately illustrated in FIG. 3 (Boolean interconnection network 210, data interconnection network 240, and interconnect 220), collectively and generally referred to herein as "interconnect", "interconnection(s)", "interconnection network(s)" or MIN, provide selectable (or switchable) connections between and among the controller 120, the memory 140, the various matrices 150, and the computational units 200 and computational elements 250 discussed below, providing the physical basis for the configuration and reconfiguration referred to herein, in response to and under the control of configuration signaling generally referred to herein as "configuration information". In addition, the various interconnection networks (110, 210, 240 and 220) provide selectable, routable or switchable data, input, output, control and configuration paths, between and among the controller 120, the memory 140, the various matrices 150, and the computational units 200 and computational elements 250, in lieu of any form of traditional or separate input/output busses, data busses, DMA, RAM, configuration and instruction busses. In other words, the configuration information is utilized to select or switch various connections between or among computational elements 250 and, in so doing, configures or reconfigures the computational elements 250 to perform different functions, operations, or algorithmic elements.

The various matrices or nodes 150 are reconfigurable and heterogeneous, namely, in general, and depending upon the desired configuration: reconfigurable matrix 150A is generally different from reconfigurable matrices 150B through 150N; reconfigurable matrix 150B is generally different from reconfigurable matrices 150A and 150C through 150N; reconfigurable matrix 150C is generally different from reconfigurable matrices 150A, 150B and 150D through 150N, and so on. The various reconfigurable matrices 150 each generally contain a different or varied mix of adaptive and reconfigurable computational (or computation) units (200, FIG. 3); the computational units 200, in turn, generally contain a different or varied mix of fixed, application specific computational elements (250, FIG. 3), which may be adaptively connected, configured and reconfigured in various ways to perform varied functions, through the various interconnection networks. In addition to varied internal configurations and reconfigurations, the various matrices 150 may be connected, configured and reconfigured at a higher level, with respect to each of the other matrices 150, through the matrix interconnection network 110.

The ACE architecture utilizes a plurality of fixed and differing computational elements, such as (without limitation) correlators, multipliers, complex multipliers, adders, demodulators, interconnection elements, routing elements, combiners, finite state machine elements, reduced instruction set (RISC) processing elements, bit manipulation elements, input/output (I/O) and other interface elements, and the lower-level "building blocks" which form these units, which may be configured and reconfigured, in response to configuration information, to form the functional blocks (computational units and matrices) which may be needed, at any given or selected time, to perform higher-level functions and, ultimately, to execute or perform the selected operating mode, such as to perform wireless communication functionality, including channel acquisition, voice transmission, multimedia and other data processing. Through the varying levels of interconnect, corresponding algorithms are then implemented, at any given time, through the configuration and reconfiguration of fixed computational elements (250), namely, implemented within hardware which has been optimized and configured for efficiency, i.e., a "machine" is configured in real-time which is optimized to perform the particular algorithm.

Next, the ACE architecture also utilizes a tight coupling (or interdigitation) of data and configuration (or other control) information, within one, effectively continuous stream of information. This coupling or commingling of data and configuration information, referred to as "silverware" or as a "silverware" module, is the subject of another patent application. For purposes of the present invention, however, it is sufficient to note that this coupling of data and configuration information into one information (or bit) stream, which may be continuous or divided into packets, helps to enable real-time reconfigurability of the ACE 100, without a need for the (often unused) multiple, overlaying networks of hardware interconnections of the prior art. For example, as an analogy, a first configuration of computational elements at a first period of time, as the hardware to execute a corresponding algorithm during or after that first period of time, may be viewed or conceptualized as a hardware analog of "calling" a subroutine in software which may perform the same algorithm. As a consequence, once the configuration of the computational elements has occurred (i.e., is in place), as directed by (a first subset of) the configuration information, the data for use in the algorithm is immediately available as part of the silverware module. The same computational elements may then be reconfigured for a second period of time, as directed by second configuration information (i.e., a second subset of configuration information), for execution of a second, different algorithm, also utilizing immediately available data. The immediacy of the data, for use in the configured computational elements, provides a one or two clock cycle hardware analog to the many separate software steps of determining a memory address, fetching stored data from the addressed registers, and performing the various operations on the data. This has the further result of additional efficiency, as the configured computational elements may execute, in comparatively few clock cycles, an algorithm which may require orders of magnitude more clock cycles for execution if called as a subroutine in a conventional microprocessor or digital signal processor ("DSP").

This use of silverware modules, as a commingling of data and configuration information, in conjunction with the reconfigurability of a plurality of heterogeneous and fixed computational elements 250 to form adaptive, different and heterogeneous computation units 200 and matrices 150, enables the ACE 100 architecture to have multiple and different modes of operation. For example, when included within a hand-held device, given a corresponding silverware module, the ACE 100 may have various and different operating modes as a cellular or other mobile telephone, a music player, a pager, a personal digital assistant, and other new or existing functionalities. In addition, these operating modes may change based upon the physical location of the device. For example, while configured for a first operating mode, using a first set of configuration information, as a CDMA mobile telephone for use in the United States, the ACE 100 may be reconfigured using a second set of configuration information for an operating mode as a GSM mobile telephone for use in Europe.

Referring again to FIG. 2, the functions of the controller 120 (preferably matrix (KARC) 150A and matrix (MARC) 150B, configured as finite state machines) may be explained with reference to a silverware module, namely, the tight coupling of data and configuration information within a single stream of information, with reference to multiple potential modes of operation, with reference to the reconfigurable matrices 150, and with reference to the reconfigurable computation units 200 and the computational elements 250 illustrated in FIG. 3. As indicated above, through a silverware module, the ACE 100 may be configured or reconfigured to perform a new or additional function, such as an upgrade to a new technology standard or the addition of an entirely new function, such as the addition of a music function to a mobile communication device. Such a silverware module may be stored in the matrices 150 of memory 140, or may be input from an external (wired or wireless) source through, for example, matrix interconnection network 110. In the exemplary embodiment, one of the plurality of matrices 150 may be configured to decrypt such a module and verify its validity, for security purposes. Next, prior to any configuration or reconfiguration of existing ACE 100 resources, the controller 120, through the matrix (KARC) 150A, checks and verifies that the configuration or reconfiguration may occur without adversely affecting any pre-existing functionality, such as whether the addition of music functionality would adversely affect pre-existing mobile communications functionality. In the exemplary embodiment, the system requirements for such configuration or reconfiguration are included within the silverware module or configuration information, for use by the matrix (KARC) 150A in performing this evaluative function. If the configuration or reconfiguration may occur without such adverse affects, the silverware module is allowed to load into the matrices 150 (of memory 140), with the matrix (KARC) 150A setting up the DMA engines within the matrices 150C and 150D of the memory 140 (or other stand-alone DMA engines of a conventional memory). If the configuration or reconfiguration would or may have such adverse affects, the matrix (KARC) 150A does not allow the new module to be incorporated within the ACE 100.

Continuing to refer to FIG. 2, the matrix (MARC) 150B manages the scheduling of matrix 150 resources, clocking, and the timing of any corresponding data, to synchronize any configuration or reconfiguration of the various computational elements 250 and computation units 200 with any corresponding input data and output data. In the exemplary embodiment, timing or other clocking information is also included within a silverware module or, more generally, within configuration information, to allow the matrix (MARC) 150B through the various interconnection networks to direct a reconfiguration of the various matrices 150 in time for the reconfiguration to occur before corresponding data has appeared at any inputs of the various reconfigured computation units 200. In addition, the matrix (MARC) 150B may also perform any residual processing which has not been accelerated within any of the various matrices 150. As a consequence, the matrix (MARC) 150B may be viewed as a control unit which "calls" the configurations and reconfigurations of the matrices 150, computation units 200 and computational elements 250, in real-time, in synchronization with any corresponding data to be utilized by these various reconfigurable hardware units, and which performs any residual or other control processing. Other matrices 150 may also include this control functionality, with any given matrix 150 capable of calling and controlling a configuration and reconfiguration of other matrices 150.

FIG. 3 is a block diagram illustrating, in greater detail, a reconfigurable matrix 150 with a plurality of computation units 200 (illustrated as computation units 200A through 200N), and a plurality of computational elements 250 (illustrated as computational elements 250A through 250Z), and provides additional illustration of many exemplary types of computational elements 250. As illustrated in FIG. 3, any matrix 150 generally includes a matrix controller 230, a plurality of computation (or computational) units 200, and as logical or conceptual subsets or portions of the matrix interconnect network 110, a data interconnect network 240 and a Boolean interconnect network 210. As mentioned above, in the exemplary embodiment, at increasing "depths" within the ACE 100 architecture, the interconnect networks become increasingly rich, for greater levels of adaptability and reconfiguration. The Boolean interconnect network 210, also as mentioned above, provides the reconfiguration and data interconnection capability between and among the various computation units 200, and is preferably small (i.e., only a few bits wide), while the data interconnect network 240 provides the reconfiguration and data interconnection capability for data input and output between and among the various computation units 200, and is preferably comparatively large (i.e., many bits wide). It should be noted, however, that while conceptually divided into reconfiguration and data capabilities, any given physical portion of the matrix interconnection network 110, at any given time, may be operating as either the Boolean interconnect network 210, the data interconnect network 240, the lower level interconnect 220 (between and among the various computational elements 250), or other input, output, configuration, or connection functionality.

Continuing to refer to FIG. 3, included within a computation unit 200 are a plurality of computational elements 250, illustrated as computational elements 250A through 250Z (individually and collectively referred to as computational elements 250), and additional interconnect 220. The interconnect 220 provides the reconfigurable interconnection capability and input/output paths between and among the various computational elements 250. As indicated above, each of the various computational elements 250 consist of dedicated, application specific hardware designed to perform a given task or range of tasks, resulting in a plurality of different, fixed computational elements 250. Utilizing the interconnect 220, the fixed computational elements 250 may be reconfigurably connected together into adaptive and varied computational units 200, which also may be further reconfigured and interconnected, to execute an algorithm or other function, at any given time, utilizing the interconnect 220, the Boolean network 210, and the matrix interconnection network 10. While illustrated with effectively two levels of interconnect (for configuring computational elements 250 into computational units 200, and in turn, into matrices 150), for ease of explanation, it should be understood that the interconnect, and corresponding configuration, may extend to many additional levels within the ACE 100. For example, utilizing a tree concept, with the fixed computational elements analogous to leaves, a plurality of levels of interconnection and adaptation are available, analogous to twigs, branches, boughs, limbs, trunks, and so on, without limitation.

In the exemplary embodiment, the various computational elements 250 are designed and grouped together, into the various adaptive and reconfigurable computation units 200. In addition to computational elements 250 which are designed to execute a particular algorithm or function, such as multiplication, correlation, clocking, synchronization, queuing, sampling, or addition, other types of computational elements 250 are also utilized in the exemplary embodiment. As illustrated in FIG. 3, computational elements 250A and 250B implement memory, to provide local memory elements for any given calculation or processing function (compared to the more "remote" memory 140), thereby decreasing the distance and time required for data movement. In addition, computational elements 250I, 250J, 250K and 250L are configured to implement finite state machines, to provide local processing capability (compared to the more "remote" matrix (MARC) 150B), especially suitable for complicated control processing.

With the various types of different computational elements 250 which may be available, depending upon the desired functionality of the ACE 100, the computation units 200 may be loosely categorized. A first category of computation units 200 includes computational elements 250 performing linear operations, such as multiplication, addition, finite impulse response filtering, clocking, synchronization, and so on. A second category of computation units 200 includes computational elements 250 performing non-linear operations, such as discrete cosine transformation, trigonometric calculations, and complex multiplications. A third type of computation unit 200 implements a finite state machine, such as computation unit 200C as illustrated in FIG. 3, particularly useful for complicated control sequences, dynamic scheduling, and input/output management, while a fourth type may implement memory and memory management, such as computation unit 200A as illustrated in FIG. 3. Lastly, a fifth type of computation unit 200 may be included to perform bit-level manipulation, such as for encryption, decryption, channel coding, Viterbi decoding, and packet and protocol processing (such as Internet Protocol processing). In addition, another (sixth) type of computation unit 200 may be utilized to extend or continue any of these concepts, such as bit-level manipulation or finite state machine manipulations, to increasingly lower levels within the ACE 100 architecture.

In the exemplary embodiment, in addition to control from other matrices or nodes 150, a matrix controller 230 may also be included or distributed within any given matrix 150, also to provide greater locality of reference and control of any reconfiguration processes and any corresponding data manipulations. For example, once a reconfiguration of computational elements 250 has occurred within any given computation unit 200, the matrix controller 230 may direct that that particular instantiation (or configuration) remain intact for a certain period of time to, for example, continue repetitive data processing for a given application.

The profiling methodology of the present invention is also utilized in both the design and the implementation of ACE 100 circuitry. For many applications, IC functionality is already defined and existing as C or C++ code. In other circumstances, standards and algorithms for various technologies are defined and described as C or C++ code. In accordance with the present invention, this existing or legacy code is profiled based on the data parameters mentioned above. Based upon the results of this profiling, the ACE 100 circuitry, and corresponding configuration information, may be determined, preferably in an iterative fashion, as discussed below. For example, a determination may be made that certain data should be static in an ACE 100 implementation, with appropriate hardware (computational elements) configured and reconfigured around the static data, for the performance of the selected algorithm. In other circumstances, also for example, memory elements may be configured adjacent to other computational elements, to provide a very close distance (or locality of reference) between a data source location and a data destination location.

Figure 4:
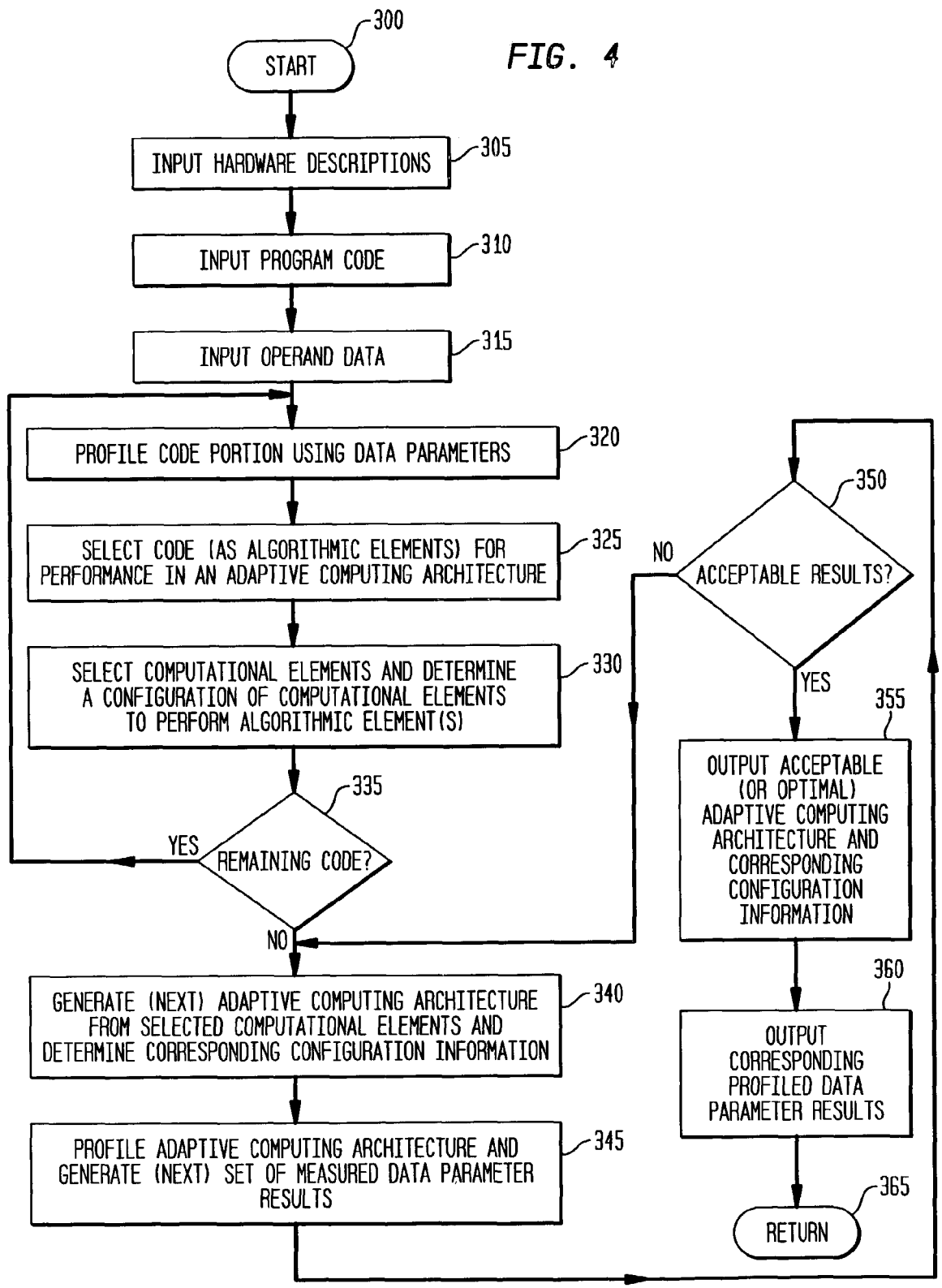
FIG. 4 is a flow diagram illustrating an iterative profiling process for code selection and circuit design in accordance with the present invention.

FIG. 4 is a flow diagram illustrating the iterative profiling process for code selection and adaptive computing architecture design in accordance with the present invention. The process begins, start step 300, with input into the profiler of a plurality of hardware architecture descriptions for a corresponding plurality of computational elements 250 (step 305), with these descriptions typically defined using any selected hardware description language (e.g., Matlab and any number of equivalent languages); input into the profiler of selected program code or program(s), such as C or C++ code, to perform one or more specific, selected functions, operations or algorithms (step 310), such as wireless communication algorithms; and input of any operand data sets or any input parameters or settings (step 315). (As referred to herein, the profiler is an apparatus, system or other embodiment which is capable of performing the method illustrated in FIG. 1, such as a computer or workstation, by way of example and not of limitation.) Profiling is performed on a code portion, using the data parameters and other criteria, which produces measured data parameters, data parameter comparative results, and other statistics (step 320), and one or more corresponding algorithmic elements (of the code portion) are determined or selected for execution in an ACE 100 (step 325). For example, such code may be selected because of its measured data parameters, such as because of poor resource usage, or because of high power consumption, such that greater performance may be achieved through an ACE 100 implementation. The method then selects one or more computational elements, and determines a configuration of the computational elements which will perform the algorithmic element (of the selected or candidate code, step 330. When there is remaining code to be profiled, step 335, the method returns to step 320, and iterates until all of the input program code has been profiled.

When there is no remaining code to be profiled in step 335, the method proceeds to step 340, and generates an adaptive computing (or ACE) architecture from the selected computational elements and determines the overall configuration information needed for the adaptive computing (or ACE) architecture to perform the algorithms of the input program code. In an initial iteration, this process results in a "first generation" ACE 100 architecture (or a subpart computational unit 200) and corresponding configuration information, with "next generation" architectures and configuration information generated with subsequent iterations.

The adaptive computing architecture may then be profiled as various algorithmic elements are performed, based upon the data parameters and other criteria, with the generation of another (or next) set of profiled data parameter results (or measured data parameters), step 345. If this set of profiled data parameter results are not optimal or acceptable in step 350, the method returns to step 340 and iterates, generating a next generation adaptive computing (or ACE) architecture and corresponding configuration information, followed again by profiling and generating another set of profiled data parameter results, step 345.

The determination of acceptability or optimality in step 350 may be performed in any number of ways, such as by using a predetermined criterion of optimality, such as a particular level or score expressed in data operational units, or by comparing the various sets of profiled data parameter results after repeated iterations, and selecting the one or more of the better or best adaptive computing (or ACE) architectures of those generated in repeated iterations of step 340. (It should be noted that optimization is used herein in a very broad sense, to mean and include merely desired or acceptable for one or more purposes, such as for a selected operating mode of a plurality of operating modes, for example, and not just meaning "most" desired or favorable.)

When optimal or acceptable results have been obtained in step 350, the method outputs the comparatively optimal, selected adaptive computing (or ACE) architecture and corresponding configuration information, step 355, and outputs the corresponding profiled data parameter results (such as in the form of a data structure), step 360, and the method may end, step 365. It should be noted that there may be a plurality of optimal adaptive computing (or ACE) architectures produced, depending upon any number of factors or constraints imposed; for example, the architecture may have several operating modes, with any given architecture better for one of the operating modes compared to another operating mode.

In the exemplary embodiment, where execution of the algorithmic elements of the program may be optimized through the ACE 100 architecture and corresponding configuration information, the program code may have one or more of the following characteristics: (1) frequently executed code, which may be more appropriately implemented as hardware (i.e., computational elements 250); (2) sequentially executed programming code that could be distributed for parallel execution across computational units 200; (3) inappropriate data typing resulting in wasted memory resources; (4) unnecessary data movement, such that the data should remain static with logic (computational elements 250) configured and reconfigured around the static data; and (5) a distant locality of reference for data, such that source and destination locations for data are comparatively far apart, or a data location "distant" from the computation units 200 or computational elements 250 acting upon the data. Other code or portions of code, such as those only utilized on a single occasion or those involving complicated control sequences, may be performed on various computational units 200 configured as finite state machines, as discussed above, or performed utilizing a separate or additional processor, depending upon selection of an overall system embodiment which may include the adaptive computing (or ACE) architecture with other processor components.

In the exemplary embodiment, the significant measurements of the profiler are those made for the various data parameters discussed above, such as data movement, size, speed and location, and resource utilization, including memory utilization (e.g., frequency of access, load/stores, and so on). Power (consumption and/or dissipation) and other performance metrics may also be assigned to these data parameter measurements, or measured based upon other statistics, providing additional information for use in IC design and evaluation.

As discussed above, the profiling methodology of the present invention may be utilized to evaluate program code on a variety of levels, such as on a code or program level, where the plurality of data parameters are applied to what data does within the program itself (e.g., at a "C" or "C++" function level). The profiling methodology of the present invention may be utilized to evaluate program code on a processor level, where the plurality of data parameters are applied to what data does within a microprocessor of DSP, for example, and may provide a useful point of comparison with profiling of the code on an adaptive computing (or ACE) architecture. The profiled data parameter results from these two types of profiling applications may be referred to, respectively, as "coarse grain" statistics or performance metrics (for the code level), and comparatively lower-level "fine grain" statistics or performance metrics (for the processor or architecture level).

In evaluating program code, the profiler may also measure resource utilization and execution speed using additional metrics or parameters. In the exemplary embodiment, in addition to measurements for the data parameters, other coarse grain measurements include (without limitation): (1) function call metrics, an architecture-independent quantity of how many times a function is executed in the operation; (2) function execution time, an architecture-independent quantity of time in seconds and relative percentage of execution time a function requires to complete; (3) function execution time, including child functions invoked, also architecture-independent and expressed in absolute time in seconds and relative percentage of execution time; (4) memory consumption of the function, measured in bytes, an architecture-independent metric calculated for a complete program, as well as for each component function; and (5) memory throughput, as average throughput, expressed in bytes per second for execution of the complete program and each component function.

In the exemplary embodiment, in addition to measurements for the data parameters, other fine grain measurements determine CPU instruction level activity, defined as the number of machine instructions (e.g., add, multiply, load) executed during program execution. The measurements include the number of times each instruction is executed, globally and per function, classified by type (arithmetic, memory, program control etc.), such as add, multiply, subtract, divide, clear, move, load, swap, jump, and branch. For example, an instruction call profile for some function $f_1$ on some dataset d may indicate that exactly 100 additions, 50 multiplications and 25 divisions are required. This metric is architecture-independent, meaning that the same number and type of instructions will be performed by function $f_1$ regardless of the processor architecture. These additional fine grain measurements may or may not be applicable to an adaptive computing (or ACE) architecture.

In addition to reporting statistics for a function, the profiler can furthermore distinguish between function "call" and function "execution". During function call, some overhead work occurs, such as parameter passing and context switching, that can be distinguished from the actual operations the function was designed to do. Simple functions, when they are executed a great number of times, may exhibit large execution times in calling the function. One programming remedy to reduce excessive overhead expenditure is to embed the function's program code within the driver, or master program that invokes the function many times. This is called "inlining" the code. Profiler statistics may be used in the determination of whether inlining should occur. The adaptive computing (or ACE) architecture may be designed, with corresponding configuration information, to similarly reduce (if not eliminate) such overhead.

Often program code executes differently depending upon input operand data or other input parameters passed to the function (of either the code or the hardware). In the exemplary embodiment, as an option, several profiles of function performance may be created based upon different input operand data or input parameter values. Similarly, the size or content of different input data sets (or other operand data) may affect performance. The profiler of the present invention can measure performance with several input data sets, and report worst case, best case, as well as average metrics.

As indicated above, one of the truly novel and important features of the present invention is the calculation or creation of an overall, comparative performance metric, referred to as a data parameter comparative result, in a new measurement unit referred to herein as a "data computational unit", based upon the measured data parameters (profiled data parameter results), for any given architecture or program, for example. Various sets of measured data parameters (profiled data parameter results) may be generated, with corresponding data operational units, based upon various hardware architectures, based upon corresponding algorithms or algorithmic elements, and based upon various input data sets. Using the comparative data operational units, an optimal architecture may be selected, with a corresponding set of optimal profiled data parameter results.

In the exemplary embodiment, for each set of profiled data parameter results, the profiler may calculate an overall, data parameter comparative result in "data operational units" as a measure, among other things, of data handling efficiency, power consumption, operating speed, and so on. In accordance with the present invention, a data operational unit is unit measure, which may be represented as a real number, which in general is calculated or created as a result of a selected combination (such as a weighted sum or product) of one or more of the measured data parameters (for a selected plurality of the data parameters), with or without weighting or other biasing, to form a data parameter comparative result in data operational units. A practitioner skilled in the art, depending upon the purposes of the application, could use myriad different methods and types of calculations and combinations, selecting different data parameter measurements of the profiled data parameter results, and potentially biasing each data parameter differently.

For example, for a selected embodiment, distance between memory locations for data movement, and distance between the data location and where it will be processed (locality of reference), may be among the more significant data parameters, as shorter distances and closer localities of reference may be indicative of faster operation. As a consequence, in determining a data parameter comparative result, expressed in data operational units, distance and locality of reference may be provided with increased weighting or biasing compared to, for example, access frequency or data persistence. Continuing with the example, the data parameter comparative result may be determined as a weighted ($\beta$, $\beta$, $\gamma$, $\delta$) sum, such as $\alpha$(distance)+$\beta$(locality)+$\gamma$(frequency)+$\delta$(persistence), where in this case $\alpha$, $\beta$, $>>\gamma$, $\delta$.

It should be noted that, as discussed in greater detail below, the measurements themselves comprising the profiled data parameter results should be made, modified or converted into to a form to allow such combination into an overall, comparative result expressed in data operational units. Such conversion also may be accomplished through a weighting mechanism, as discussed above.

In an alternative embodiment, the underlying, profiled data parameter results, for each data parameter, are measured and converted directly into data operational units, which are then further combined to form an overall data parameter comparative result.

The measurements of the data parameters themselves, to form the measured data parameters (also referred to as profiled data parameter results) may also be made in relative or absolute (empirical) measures, such as for data movement and locality of reference distances. Other measures, such as speed or access frequency, may be determined or estimated as a number of clock cycles, and translated into a power measurement for an amount of power that a given movement of data will consume.

As mentioned above, a small "locality of reference" is highly desirable in computing, and particularly so in the reconfigurable environment, where traditional data movement to computational units may be supplanted by positioning or creating computational units positioned closer to persistent data.

Absolute measures may be utilized to determine data distances (such as the distance between source and destination locations), based upon a known architecture, such as the distance between primary and tertiary caches. Another method to measure distances among reconfigurable matrices is relativistic or comparative, using comparative measures based upon a potentially changing hardware topology, which may be more appropriate for the adaptive computing engine.

In addition to embodiment within an adaptive computing architecture such as the ACE 100, the profiler may be embodied in any number of forms, such as within a computer, within a workstation, or within any other form of computing or other system used to profile program code. The profiler may be embodied as any type of software, such as C, C++, C#, Java, or any other type of programming language, including as configuration information (as a form of software) to direct a configuration within an adaptive computing architecture to perform the various profiling functions. The profiler may be embodied within any tangible storage medium, such as within a memory or storage device for use by a computer, a workstation, any other machine-readable medium or form, or any other storage form or medium for use in a computing system to profile program code. Such storage medium, memory or other storage devices may be any type of memory device, memory integrated circuit ("IC"), or memory portion of an integrated circuit (such as the resident memory within a processor IC or ACE 100), including without limitation RAM, FLASH, DRAM, SRAM, SDRAM, MRAM, FeRAM, ROM, EPROM or $E^2$PROM, or any other type of memory, storage medium, or data storage apparatus or circuit, depending upon the selected embodiment. For example, without limitation, a tangible medium storing computer or machine readable software, or other machine-readable medium, is interpreted broadly and may include a floppy disk, a CDROM, a CD-RW, a magnetic hard drive, an optical drive, a quantum computing storage medium or device, a transmitted electromagnetic signal (e.g., a computer data signal embodied in a carrier wave used in internet downloading), or any other type of data storage apparatus or medium, and may have a static embodiment (such as in a memory or storage device) or may have a dynamic embodiment (such as a transmitted electrical signal).

The data parameter comparative results and the measured data parameters may be stored, transmitted, or displayed in the form of a data structure embodied in any tangible medium, data signal or other carrier wave. Such a data structure, for example, may be an array of a plurality of fields stored in a form of memory or in a data storage device, such as the various forms of memory and other storage media and devices discussed above. In addition, such a data structure may also be displayed or illustrated, or converted into a form suitable for such display or illustration. For example, the display of the measured data parameters may be multidimensional and illustrated via any form or type of visual display, such as a video or holographic display, or may be displayed in two dimensions as a graphical or tabular display. For purposes of example, FIG. 5 is a graphical diagram visually illustrating an exemplary data structure embodiment 400 in accordance with the present invention.

Referring to FIG. 5, the exemplary data structure 400 comprises a plurality of fields, a first field 410, a second field 420, a third field 430, and a fourth field 440. The first field 410 comprises an identification or designation of the functions of the program code to be profiled, such as multiply, divide, add, and so on, as determined during profiling, with an identification or designation of a corresponding input data set. As illustrated as an example, first field 410 provides a plurality of functions with two input data sets, designated "function/input data set", such as function_1/input_data_set_1, function_1/input_data_set_2, function_2/input_data_set_1, function_2/input_data_set_2, and so on. The second field 420 comprises a designation or identification of a plurality of data parameters, in any ordering, and as illustrated includes data location (for static data), data size (input and output), data type, data source and destination locations (for dynamic data), data pipeline length, locality of reference, distance of data movement, speed of data movement, data persistence, data access frequency, number of data load/stores, degree of cache, and register or memory usage. In this exemplary embodiment, the second field 420 also includes designation of a corresponding algorithmic element, corresponding hardware location for the algorithmic element, memory throughput, execution time and frequency, power consumed, and number of instructions utilized.

The third field 430 provides a listing of the measured data parameters (also referred to as profiled data parameter results), for each data parameter of the plurality of data parameters (of field 420), and for each function and input data set (of field 410), and is formed as the profiler is operating. As the profiler operates, it determines which function (of field 410) is occurring in the program code, and with the input data set, performs a measurement or determination of the plurality of data parameters, providing the measured data parameters of field 430. These profiled data parameter results may then be combined, in various forms, to provide one or more data parameter comparative results of a fourth field 440. As illustrated in the fourth field 440, data parameter comparative results are provided for each function and input data set (of field 410), with an overall data parameter comparative result provided for the entire program or architecture being profiled.

In the exemplary embodiment, the profiler is repeatedly run, beginning with the entire program or code set to be incorporated into an ACE architecture, with a target hardware configuration and subsequent modifications, until additional iterations indicate diminishing returns of further acceleration and/or an optimal ACE architecture (with configuration information) is determined. As adjustments are made, certain functions are removed from the code completely, with corresponding algorithmic elements being performed by the computational units 200 of the ACE 100 with its configuration information. Other code, if any, which may not become part of the ACE 100 with configuration information, may be maintained as separate code for separate execution within a processor or within an ACE configured as a processor.

In another exemplary embodiment, the profiler may also reside within the ACE 100 itself, with the profiler operating upon the actual circuit design or structure of the ACE as it is operating. The ACE 100 is capable of refining and adjusting its own configurations and reconfigurations, in the field, without outside intervention, through modification of the configuration information for any given function or operation. As the ACE operates, based upon the profiled data parameter results, the ACE 100 may determine that it should change or modify its configuration for performance of one or more functions or operations. For example, based upon profiled data parameter results such as distance of data movement, the ACE may reconfigure itself by providing additional data memory in closer proximity to the area of its circuit performing a corresponding calculation, store data in new locations, modify data types, and so on.

Numerous advantages of the present invention may be readily apparent. The profiling tool of the invention evaluates both program code and hardware architecture based upon a plurality of data parameters, such as data movement, size and speed. Both existing (or legacy) code and of new forms of code are profiled, within a variety of reconfigurable hardware environments or typical processing environments. The profiler of the invention provides profiling information based upon data parameters or metrics such as data location (for static data), data type, data size (input and output), data source and destination locations (for dynamic data), data pipeline length, locality of reference, distance of data movement, speed of data movement, data access frequency, number of data load/stores, degree of cache, register or memory usage, data persistence, corresponding algorithmic element, and corresponding hardware location for the algorithmic element. The profiler of the invention may also provide other measurements of resource utilization, such as memory throughput, execution time and frequency, power consumed, number of instructions utilized, and so on.

The various exemplary embodiments of the profiler of the invention provide unique advantages, such as use in actual circuit design and implementation. The various exemplary embodiments also provide for profiling of actual circuit designs, and self-modification of adaptive or reconfigurable circuitry through self-profiling.

The present invention also provides a novel unit of measure, a "data operational unit", for use in providing data parameter comparative results. This comparative measure may be utilized to provide direct comparison of otherwise incomparable or incongruent objects, such as allowing direct comparison of a computing program with a hardware architecture (which performs the algorithms of the program).

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A computer-implemented method for generating a reconfigurable architecture for a hardware adaptive computing engine (ACE) having a set of one or more matrices, each matrix comprising a set of one or more computation units, each computation unit comprising a set of one or more computational elements, and the reconfigurable architecture being reconfigurable in real time when ACE configuration code is executed, the method comprising:
profiling ACE configuration code to make measurements of a plurality of data parameters, wherein the code is executable and embodies a plurality of algorithmic elements, and wherein the code, when executed, causes a first function to be performed and a second function to be performed;
based on the plurality of data parameters measured, selecting which of the algorithmic elements of the code are to be implemented in the reconfigurable architecture for the first function and the second function;
receiving a plurality of hardware architecture descriptions of the sets of matrices, computation units and computational elements;
based on the hardware architecture descriptions and the selected algorithmic elements, selecting one or more computational elements;
selecting an interconnection network for causing the selected one or more computational elements to be connected together in a first architecture configuration in real time for performing the first function, and
switching, when the ACE configuration code is executing, the interconnection network for causing the selected one or more computational elements to be connected together in a second architecture configuration for performing the second function, the switching including changing the connections among the computational elements based on the profiling to cause the computational elements to be connected in a first architecture configuration for performing the first function and cause the computational elements to be connected in a second, different architecture configuration for performing the second function.

2. The method of claim 1, further comprising:
profiling of the reconfigurable architecture to obtain performance results; and
iteratively performing the selecting one or more computational elements, the switching the interconnection network, and the profiling until the results are optimal.

3. The method of claim 2, wherein the optimal results are determined based on comparing the data parameters measured from profiling each generation of the reconfigurable architecture for the hardware adaptive computing engine.

4. The method of claim 2, wherein the optimal results are determined based on comparing the data parameters measured from profiling the reconfigurable architecture for the hardware adaptive computing engine to a predetermined criterion.

5. The method of claim 1, wherein the code comprises a first program to perform the first function and a second, different program to perform the second function.

6. The method of claim 1, wherein the code comprises one program having a first code portion to perform the first function and a second code portion to perform the second function.

7. The method of claim 1, wherein the reconfigurable architecture for the hardware adaptive computing engine is embodied in a single integrated circuit.

8. The method of claim 1, wherein the selecting an interconnection network further comprises:
determining a hardware location in the hardware adaptive computing engine for respective ones of the selected one or more computational elements.

9. The method of claim 1, further comprising:
based on the plurality of data parameters measured, determining power consumption for each algorithmic element of the plurality of algorithmic elements.

10. The method of claim 1, further comprising providing reconfiguration information to connect the selected one or more computational elements together in the first and second configurations.

11. A computer-implemented method for modifying the configuration of a reconfigurable architecture of a hardware adaptive computing engine (ACE) in real time when ACE configuration code is executed, the adaptive computing engine having a set of one or more matrices, each matrix comprising a set of one or more computation units, each computation unit comprising a set of one or more computational elements, the method comprising:
profiling ACE configuration code to determine a plurality of data parameters, wherein the code is executable and embodies a plurality of algorithmic elements, and wherein the code, when executed, causes a first function to be performed and a second function to be performed;

based on the plurality of data parameters measured, selecting which of the algorithmic elements of the code are to be implemented in the reconfigurable architecture for the first function and the second function;

reading a plurality of hardware architecture descriptions of the sets of matrices, computation units and computational elements;

based on the hardware architecture descriptions and the selected algorithmic elements, selecting one or more computational elements;

switching, when the ACE configuration code is executing, the interconnection network for causing the selected one or more computational elements to be connected together in a second architecture configuration for performing the second function, the switching including changing the connections among the computational elements based on the profiling to cause the computational elements to be connected in a first architecture configuration for performing the first function and cause the computational elements to be connected in a second, different architecture configuration for performing the second function.

12. The method of claim 11, wherein the modifying further comprises:

iteratively profiling the modified architecture configuration and changing the connections among the computational elements to obtain optimal performance results.

13. The method of claim 12, wherein the optimal results are determined based on comparing data parameters measured from profiling each of the configurations of the interconnections.

14. The method of claim 12, wherein the optimal results are determined based on comparing data parameters measured from profiling each modified architecture configuration.

15. The method of claim 11, wherein the code comprises a first program to perform a first function and a second, different program to perform a second function.

16. The method of claim 11, wherein the code comprises one program having a first code portion to perform a first function and a second code portion to perform a second function.

17. The method of claim 11, wherein the data parameters are a plurality of static and dynamic data parameters comprising at least one of the following data parameters: locality of reference parameter; data location for static data; data type; input data size; output data size; data source location; data destination location; data pipeline length; distance of data movement; speed of data movement; data access frequency; number of data load/stores; cache usage; register usage; memory usage, and data persistence.

18. An integrated circuit having a reconfigurable architecture, the integrated circuit being reconfigurable in real time when configuration code is executed, the integrated circuit comprising:

a profiler for profiling configuration code to make measurements of a plurality of data parameters, wherein the code is executable to perform a first function of the code and a second function of the code and embodies a plurality of algorithmic elements a plurality of computational elements;

control logic for:
 a) selecting the algorithmic elements of the code that are to be implemented in the reconfigurable architecture for the first function and the second function based on the plurality of data parameters measured,
 b) receiving a plurality of hardware architecture descriptions of the sets of matrices, computation units and computational elements, and
 c) based on the hardware architecture descriptions and the selected algorithmic elements, selecting one or more computational elements; and a reconfigurable interconnection network using real time execution of the configuration code for selectively connecting together the plurality of computational elements in a first configuration associated with the first function of the code, by switching, when the configuration code is executing, the interconnection network and causing the selected one or more computational elements to be connected together in a second architecture configuration in real time for performing the second function, the switching including changing connections among the plurality of computational elements based on the profiling to cause the plurality of computational elements to be connected in a second, different configuration for performing the second function of the code.

19. The integrated circuit of claim 18, wherein the control logic iteratively selects configurations based on the profiling to thereby achieve optimal results.

20. The integrated circuit of claim 19, wherein the control logic determines the optimal results based on comparing data parameters measured from profiling each of the configurations.

21. The integrated circuit of claim 19, wherein the control logic determines the optimal results based on comparing data parameters measured from profiling the configuration to a predetermined criterion.

22. The integrated circuit of claim 18, wherein the code comprises a first program to perform the first function and a second, different program to perform the second function.

23. The integrated circuit of claim 18, wherein the code comprises one program having a first code portion to perform the first function and a second code portion to perform the second function.

24. The integrated circuit of claim 18, further comprising providing reconfiguration information to selectively connect together the plurality of computational elements in the first and second configurations.

* * * * *